United States Patent
Kito et al.

(10) Patent No.: US 8,148,769 B2
(45) Date of Patent: *Apr. 3, 2012

(54) NONVOLATILE SEMICONDUCTOR MEMORY DEVICE AND METHOD OF MANUFACTURING THE SAME

(75) Inventors: Masaru Kito, Yokohama (JP); Yoshiaki Fukuzumi, Yokohama (JP); Ryota Katsumata, Yokohama (JP); Masaru Kidoh, Komae (JP); Hiroyasu Tanaka, Tokyo (JP); Megumi Ishiduki, Yokohama (JP); Yosuke Komori, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 12/534,576

(22) Filed: Aug. 3, 2009

(65) Prior Publication Data
US 2010/0072538 A1 Mar. 25, 2010

(30) Foreign Application Priority Data
Sep. 25, 2008 (JP) ................................ 2008-245070

(51) Int. Cl.
*H01L 29/788* (2006.01)
(52) U.S. Cl. ................ 257/321; 257/326; 257/E21.662; 257/E27.103; 438/266; 438/268
(58) Field of Classification Search .................. 257/326, 257/321, E21.662, E27.103; 438/268, 266
See application file for complete search history.

(56) References Cited

U.S. PATENT DOCUMENTS
7,005,350 B2 * 2/2006 Walker et al. ................. 438/268
7,045,849 B2 * 5/2006 Chen et al. ..................... 257/314
7,821,058 B2 * 10/2010 Kidoh et al. ................... 257/324
(Continued)

FOREIGN PATENT DOCUMENTS
JP 61-183969 8/1986
(Continued)

OTHER PUBLICATIONS

Office Action issued Feb. 22, 2011, in Japan Patent Application No. 2008-245070 (with English translation).

(Continued)

*Primary Examiner* — Jarrett Stark
(74) *Attorney, Agent, or Firm* — Oblon, Spivak, McClelland, Maier & Neustadt, L.L.P.

(57) ABSTRACT

A nonvolatile semiconductor memory device includes a plurality of memory strings, each of which has a plurality of electrically rewritable memory cells connected in series; and select transistors, one of which is connected to each of ends of each of the memory strings. Each of the memory strings is provided with a first semiconductor layer having a pair of columnar portions extending in a perpendicular direction with respect to a substrate, and a joining portion formed so as to join lower ends of the pair of columnar portions; a charge storage layer formed so as to surround a side surface of the columnar portions; and a first conductive layer formed so as to surround the side surface of the columnar portions and the charge storage layer, and configured to function as a control electrode of the memory cells. Each of the select transistors is provided with a second semiconductor layer extending upwardly from an upper surface of the columnar portions; and a second conductive layer formed so as to surround a side surface of the second semiconductor layer with a gap interposed, and configured to function as a control electrode of the select transistors.

13 Claims, 26 Drawing Sheets

U.S. PATENT DOCUMENTS

| | | | |
|---|---|---|---|
| 7,847,342 B2* | 12/2010 | Fukuzumi et al. | 257/324 |
| 7,936,004 B2* | 5/2011 | Kito et al. | 257/324 |
| 7,983,084 B2* | 7/2011 | Tokiwa et al. | 365/185.11 |
| 2004/0124466 A1* | 7/2004 | Walker et al. | 257/344 |
| 2004/0145024 A1* | 7/2004 | Chen et al. | 257/390 |
| 2004/0232496 A1* | 11/2004 | Chen et al. | 257/390 |
| 2006/0001073 A1* | 1/2006 | Chen et al. | 257/314 |
| 2007/0252201 A1* | 11/2007 | Kito et al. | 257/331 |
| 2009/0090965 A1* | 4/2009 | Kito et al. | 257/326 |
| 2009/0108333 A1* | 4/2009 | Kito et al. | 257/324 |
| 2009/0146206 A1* | 6/2009 | Fukuzumi et al. | 257/324 |
| 2009/0224309 A1* | 9/2009 | Kidoh et al. | 257/326 |
| 2009/0230458 A1* | 9/2009 | Ishiduki et al. | 257/324 |
| 2009/0294844 A1* | 12/2009 | Tanaka et al. | 257/330 |
| 2010/0072538 A1* | 3/2010 | Kito et al. | 257/326 |

FOREIGN PATENT DOCUMENTS

| | | |
|---|---|---|
| JP | 5-48088 | 2/1993 |
| JP | 6-120490 | 4/1994 |
| JP | 6-342894 | 12/1994 |
| JP | 07-235649 | 9/1995 |
| JP | 10-125815 | 5/1998 |
| JP | 2003-068886 | 3/2003 |
| JP | 2007-266143 | 10/2007 |
| JP | 2007-317874 | 12/2007 |
| WO | WO 2009/075370 A1 | 6/2009 |

OTHER PUBLICATIONS

U.S. Appl. No. 12/679,991, filed Mar. 25, 2010, Fukuzumi et al.

Notice Concerning Filing of Arguments issued May 4, 2011 in Korea Application No. 10-2009-87023 (With English Translation).

Office Action issued Jan. 10, 2012 in Japanese Application Serial No. 2008-245070. (with English translation).

* cited by examiner

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from prior Japanese Patent Application No. 2008-245070, filed on Sep. 25, 2008, the entire contents of which are incorporated herein by reference.

BACKGROUND OF THE INVENTION

1. Field of the Invention

The present invention relates to an electrically rewritable nonvolatile semiconductor memory device and a method of manufacturing the same.

2. Description of the Related Art

Conventionally, an LSI is formed by integrating elements in a two-dimensional plane on a silicon substrate. It is common practice to increase a storage capacity of memory by reducing dimensions of (miniaturizing) an element. However, in recent years, even this miniaturization is becoming difficult in terms of cost and technology. Improvements in photolithographic technology are necessary for miniaturization, but costs required for lithographic processes are steadily increasing. Moreover, even if miniaturization is achieved, it is expected that physical limitations such as those of withstand voltage between elements will be encountered, unless the drive voltage and so on are scaled. In other words, there is a high possibility that operation as a device will become difficult.

Accordingly, in recent years, there is proposed a semiconductor memory device in which memory cells are disposed three-dimensionally in order to increase a degree of integration of memory (refer to patent document 1: Japanese Unexamined Patent Application Publication No. 2007-266143).

One conventional semiconductor memory device in which memory cells are disposed three-dimensionally uses transistors with a cylindrical column-shaped structure (patent document 1). The semiconductor memory device using the transistors with the cylindrical column-shaped structure is provided with a multi-layer conductive layer configured to form gate electrodes, and a pillar-shaped columnar semiconductor. The columnar semiconductor functions as a channel (body) portion of the transistors. A vicinity of the columnar semiconductor is provided with a memory gate insulating layer. A configuration including these conductive layer, columnar semiconductor, and memory gate insulating layer is called a memory string.

There is a need to utilize the above-described conventional technology to develop a nonvolatile semiconductor memory device having an even greater reliability.

SUMMARY OF THE INVENTION

In accordance with a first aspect of the present invention, a nonvolatile semiconductor memory device includes: a plurality of memory strings, each of which has a plurality of electrically rewritable memory cells connected in series; and select transistors, one of which is connected to each of ends of each of the memory strings, each of the memory strings comprising: a first semiconductor layer having a pair of columnar portions extending in a perpendicular direction with respect to a substrate, and a joining portion formed so as to join lower ends of the pair of columnar portions; a charge storage layer formed to surround a side surface of the columnar portions; and a first conductive layer formed to surround the side surface of the columnar portions and the charge storage layer, and configured to function as a control electrode of the memory cells, and each of the select transistors comprising: a second semiconductor layer extending upwardly from an upper surface of the columnar portions; and a second conductive layer formed to surround a side surface of the second semiconductor layer with a gap interposed, and configured to function as a control electrode of the select transistors.

In accordance with a second aspect of the present invention, a nonvolatile semiconductor memory device includes: a plurality of memory strings, each of which has a plurality of electrically rewritable memory cells connected in series, each of the memory strings comprising: a first semiconductor layer having a pair of columnar portions extending in a perpendicular direction with respect to a substrate, and a joining portion formed so as to join lower ends of the pair of columnar portions; a charge storage layer formed to surround a side surface of the columnar portions with a gap interposed; and a first conductive layer formed to surround the side surface of the columnar portions and the charge storage layer, and configured to function as a control electrode of the memory cells.

In accordance with a third aspect of the present invention, a method of manufacturing a nonvolatile semiconductor memory device, the nonvolatile semiconductor memory device including a plurality of memory strings, each of which has a plurality of electrically rewritable memory cells connected in series, and select transistors, one of which is connected to each of ends of each of the memory strings, the method comprising: forming a first conductive layer on an upper layer above a substrate; forming trenches extending in a first direction parallel to the substrate, so as to dig out the first conductive layer; forming a plurality of second conductive layers on an upper layer of the first conductive layer; forming a third conductive layer above an uppermost layer of the second conductive layers; forming through holes to pass through the plurality of the second conductive layers and the third conductive layer, and to align with vicinities of both ends in the first direction of the trenches; forming a memory gate insulating layer including a charge storage layer on a side surface facing the trenches and the through holes; forming a semiconductor layer on a side surface of the memory gate insulating layer to fill the trenches and the through holes; and forming a gap by removing the memory gate insulating layer adjacent to the semiconductor layer as far as a position between the third conductive layer and the uppermost layer of the second conductive layers.

DETAILED DESCRIPTION OF THE EMBODIMENTS

Embodiments of a nonvolatile semiconductor memory device in accordance with the present invention are described below with reference to the drawings.

First Embodiment (Configuration of a Nonvolatile Semiconductor Memory Device 100 in Accordance with a First Embodiment)

Figure 1:
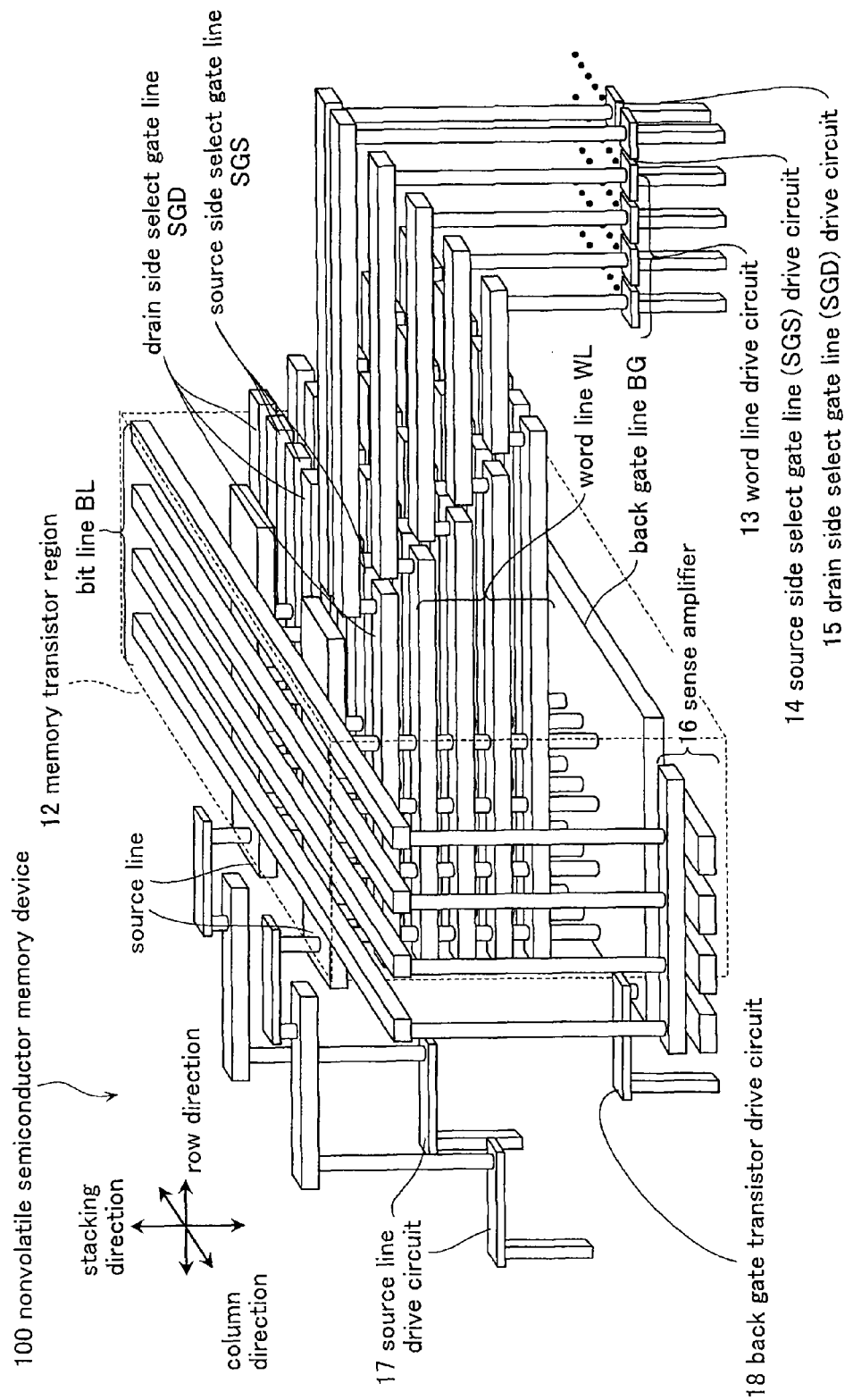
FIG. 1 shows a schematic view of a nonvolatile semiconductor memory device 100 in accordance with a first embodiment of the present invention.

FIG. 1 shows a schematic view of a nonvolatile semiconductor memory device 100 in accordance with a first embodiment of the present invention. As shown in FIG. 1, the nonvolatile semiconductor memory device 100 in accordance with the first embodiment mainly includes a memory transistor region 12, a word line drive circuit 13, a source side select gate line (SGS) drive circuit 14, a drain side select gate line (SGD) drive circuit 15, a sense amplifier 16, a source line drive circuit 17, and a back gate transistor drive circuit 18. The memory transistor region 12 includes memory transistors configured to store data. The word line drive circuit 13 controls a voltage applied to word lines WL. The source side select gate line (SGS) drive circuit 14 controls a voltage applied to a source side select gate line (SGS). The drain side select gate line (SGD) drive circuit 15 controls a voltage applied to a drain side select gate line (SGD). The sense amplifier 16 amplifies a potential read from the memory transistors. The source line drive circuit 17 controls a voltage applied to a source line SL. The back gate transistor drive circuit 18 controls a voltage applied to a back gate line BG. Note that, in addition to the above, the nonvolatile semiconductor memory device 100 in accordance with the first embodiment includes a bit line drive circuit (not shown) configured to control a voltage applied to a bit line BL.

Figure 2:
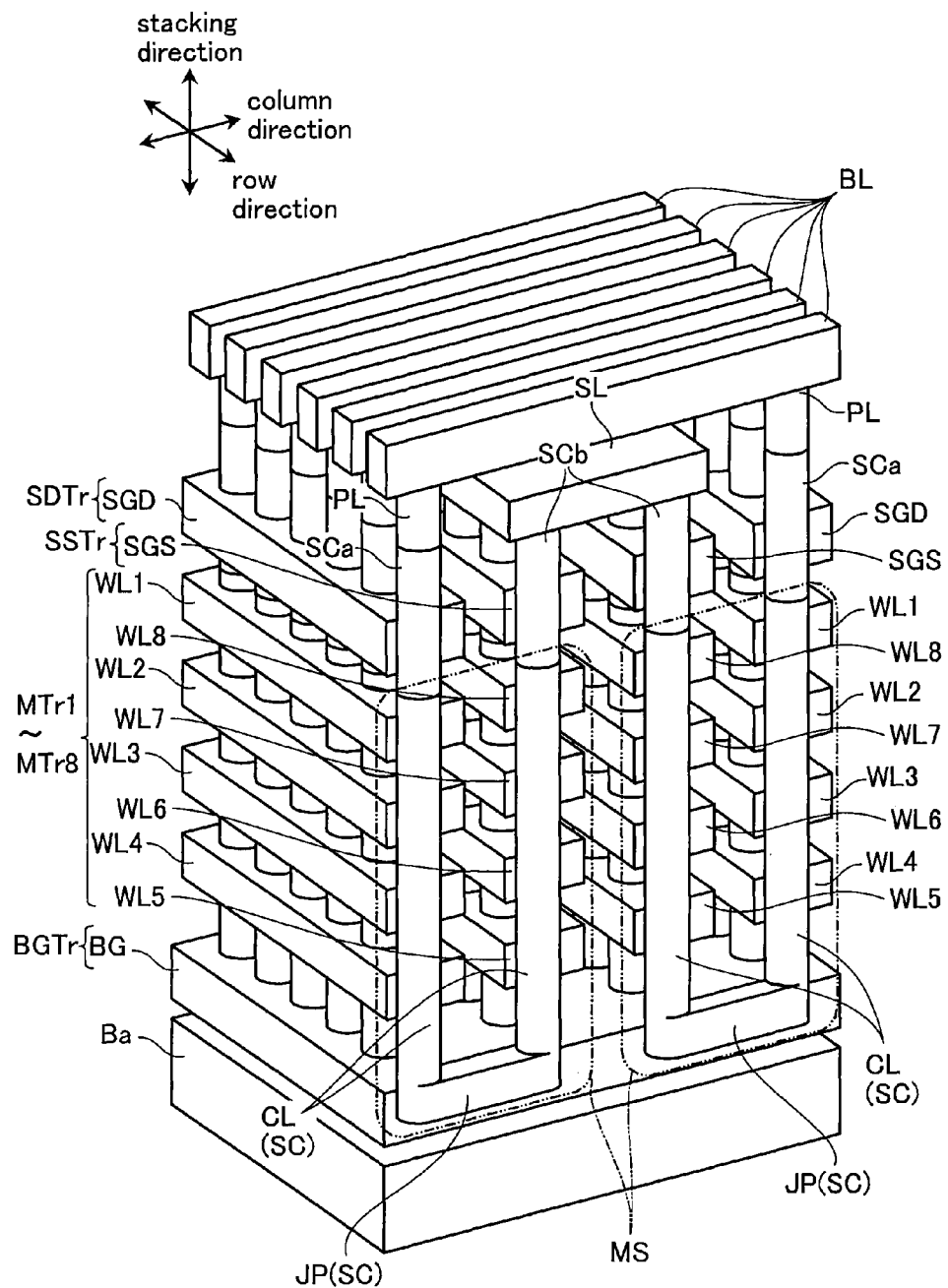
FIG. 2 is a schematic perspective view of a portion of a memory transistor region 12 of the nonvolatile semiconductor memory device 100 in accordance with the first embodiment.

FIG. 2 is a schematic perspective view of a portion of the memory transistor region 12 of the nonvolatile semiconductor memory device 100 in accordance with the first embodiment. In the first embodiment, the memory transistor region 12 includes m×n each of memory strings MS, source side select transistors SSTr, and drain side select transistors SDTr (where m and n are natural numbers). FIG. 2 shows an example where m=6 and n=2.

In the nonvolatile semiconductor memory device 100 in accordance with the first embodiment, the memory transistor region 12 is provided with a plurality of the memory strings MS. As will be described in detail later, each of the memory strings MS has a configuration in which a plurality of electrically rewritable memory transistors MTr are connected in series. The memory transistors MTr configuring the memory string MS are formed by stacking a plurality of semiconductor layers, as shown in FIGS. 1 and 2.

Each of the memory strings MS includes a U-shaped semiconductor SC, word lines WL1-WL8, and a back gate line BG.

The U-shaped semiconductor SC is formed in a U shape viewed from a row direction. The U-shaped semiconductor SC includes a pair of columnar portions CL extending in a substantially perpendicular direction with respect to a semiconductor substrate Ba, and a joining portion JP formed so as to join lower ends of the pair of columnar portions CL. Note that the columnar portions CL may be of a cylindrical column shape or of a prismatic column shape. Moreover, the columnar portions CL may be of a column shape that has a tiered shape. Here, the row direction is a direction orthogonal to a stacking direction, and a column direction to be described later is a direction orthogonal to the stacking direction and the row direction.

The U-shaped semiconductors SC are disposed such that a line joining central axes of the pair of columnar portions CL is parallel to the column direction. Furthermore, the U-shaped semiconductors SC are disposed to form a matrix in planes configured from the row direction and the column direction.

The word lines WL1-WL8 in each layer have a shape extending in parallel to the row direction. The word lines WL1-WL8 in each layer are formed in a repeating manner in lines insulated and isolated from each other and having a predetermined pitch in the column direction. The word line WL1 is formed in a same layer as the word line WL8. Similarly, the word line WL2 is formed in a same layer as the word line WL7, the word line WL3 is formed in a same layer as the word line WL6, and the word line WL4 is formed in a same layer as the word line WL5.

Gates of the memory transistors MTr1-MTr8 provided at a same position in the column direction and forming a line in the row direction are connected to identical word lines WL1-WL8. An end in the row direction of each of the word lines WL1-WL8 is formed in a stepped shape. Each of the word lines WL1-WL8 is formed so as to surround a plurality of the columnar portions lined up in the row direction.

Figure 3:
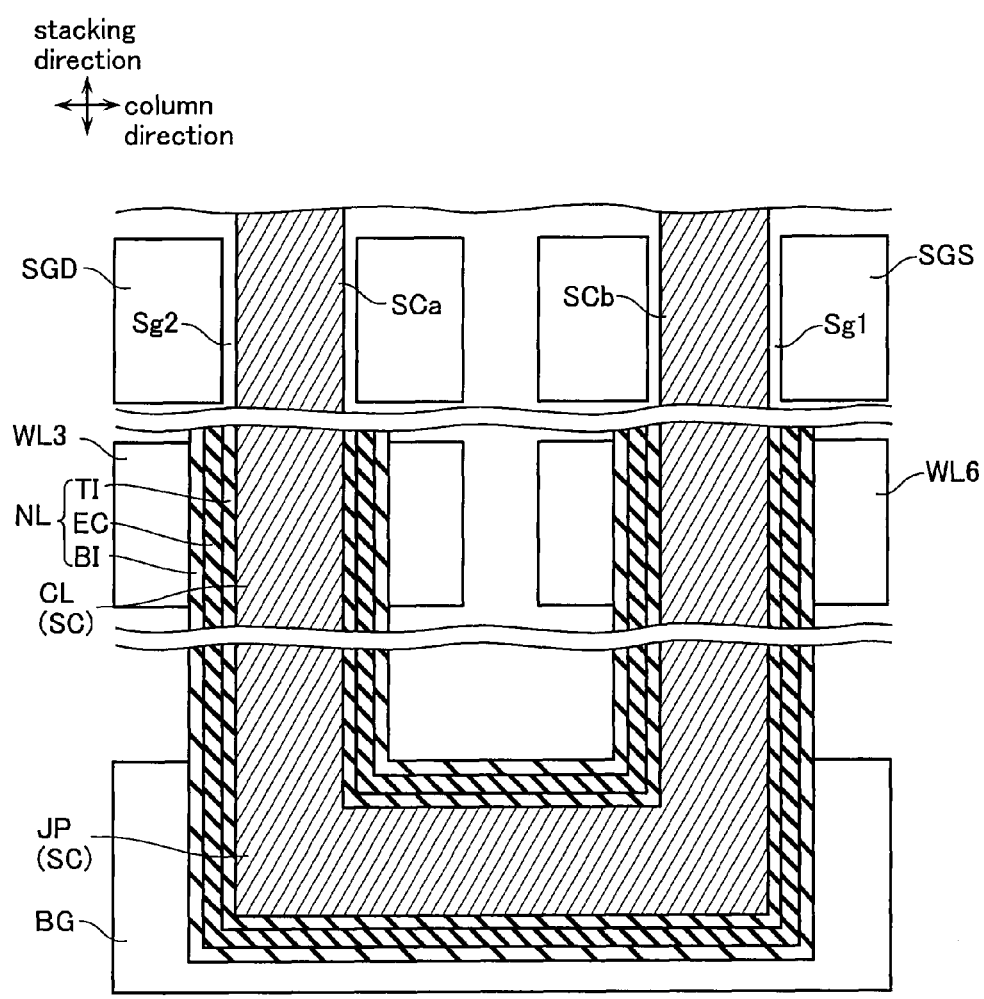
FIG. 3 is a partial enlarged cross-sectional view of FIG. 2.

Formed between the word lines WL1-WL8 and the columnar portion CL is an ONO (Oxide-Nitride-Oxide) layer NL, as shown in FIG. 3. The ONO layer NL includes a tunnel insulating layer TI adjacent to the columnar portion CL, a charge storage layer EC adjacent to the tunnel insulating layer TI, and a block insulating layer BI adjacent to the charge storage layer EC. The charge storage layer EC has a function of accumulating a charge. To express the above-described configuration in other words, the charge storage layer EC is formed so as to surround a side surface of the columnar portion CL; and each of the word lines WL1-WL8 is formed so as to surround the charge storage layer EC.

The drain side select transistor SDTr includes a columnar semiconductor SCa and the drain side select gate line SGD. The columnar semiconductor SCa is formed so as to extend upwardly from an upper surface of one of the columnar portions CL in a perpendicular direction with respect to the substrate Ba. The drain side select gate line SGD is provided upwardly of an uppermost word line WL1 of the word lines. The drain side select gate line SGD has a shape extending in parallel to the row direction. The drain side select gate line SGD is formed in a repeating manner in lines having an alternating predetermined pitch in the column direction, so as to sandwich the source side select gate line SGS to be described hereafter. The drain side select gate line SGD is formed so as to surround each of a plurality of the columnar semiconductors SCa lined up in the row direction with a gap interposed.

The source side select transistor SSTr includes a columnar semiconductor SCb and the source side select gate line SGS. The columnar semiconductor SCb is formed so as to extend upwardly from an upper surface of another of the columnar portions CL. The source side select gate line SGS is provided upwardly of an uppermost word line WL8 of the word lines. The source side select gate line SGS has a shape extending in parallel to the row direction. The source side select gate line SGS is formed in a repeating manner in lines having a predetermined pitch in the column direction, sandwiching the aforementioned drain side select gate line SGD therebetween. The source side select gate line SGS is formed so as to surround each of a plurality of the columnar semiconductors SCb lined up in the row direction with a gap interposed.

The back gate line BG is formed extending two-dimensionally in the row direction and the column direction so as to cover a lower portion of a plurality of the joining portions JP. Formed between the back gate line BG and each of the joining portions JP is the aforementioned ONO layer NL, as shown in FIG. 3.

Description continues returning again to FIG. 2. The columnar semiconductors SCb are formed adjacently in the column direction. Upper ends of a pair of the columnar semiconductors SCb are connected by the source line SL. The source line SL is commonly provided to the pair of columnar semiconductors SCb.

The bit lines BL are formed at upper ends of the columnar semiconductors SCa where they are surrounded by the drain side select gate line SGD, with plug lines PL interposed. Each of the bit lines BL is formed so as to be positioned upwardly of the source line SL. Each of the bit lines BL is formed in a repeating manner in lines extending in the column direction and having a predetermined spacing in the row direction.

Figure 4:
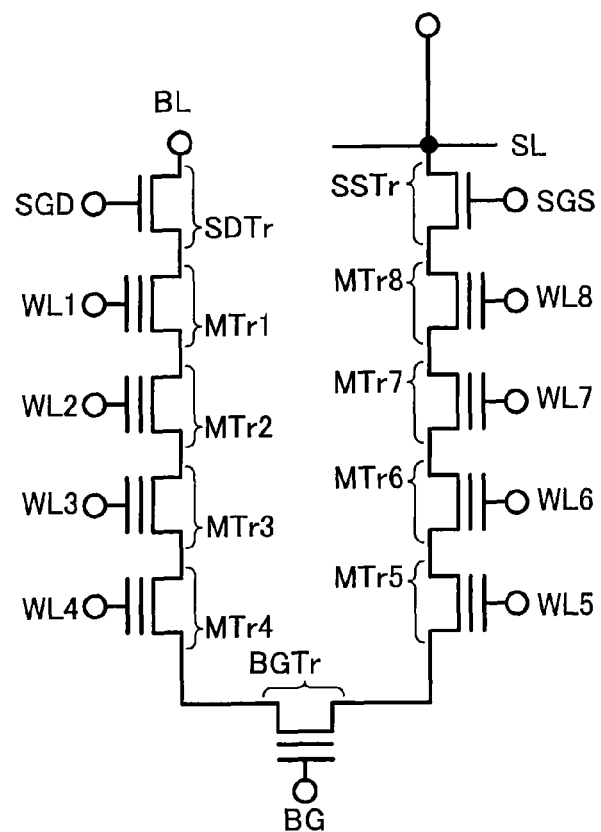
FIG. 4 is a circuit diagram of a memory string MS, a drain side select transistor SDTr, and a source side select transistor SSTr in the first embodiment.

Next, a configuration of a circuit constituted by the memory string MS, the drain side select transistor SDTr, and the source side select transistor SSTr in the first embodiment is described with reference to FIGS. 2-4. FIG. 4 is a circuit diagram of a single one of the memory strings MS, the drain side select transistor SDTr, and the source side select transistor SSTr in the first embodiment.

Each of the memory strings MS in the first embodiment has eight electrically rewritable memory transistors MTr1-MTr8 connected in series, as shown in FIGS. 2-4. The source side select transistor SSTr is connected to one of two ends of the memory string MS and the drain side select transistor SDTr is connected to another of the two ends of the memory string MS. A back gate transistor BGTr is provided in the memory string MS (between the memory transistor MTr4 and the memory transistor MTr5).

Each of the memory transistors MTr1-8 is configured by the columnar portion CL, the ONO layer NL (the charge storage layer EC), and the word lines WL1-8. An edge portion of the word lines WL1-8 in contact with the ONO layer NL functions as a control gate electrode of the memory transistors MTr1-8.

The drain side select transistor SDTr is configured by the columnar semiconductor SCa and the drain side select gate line SGD. An edge portion of the drain side select gate line SGD facing the gap functions as a control gate electrode of the drain side select transistor SDTr.

The source side select transistor SSTr is configured by the columnar semiconductor SCb and the source side select gate line SGS. An edge portion of the source side select gate line SGS facing the gap functions as a control gate electrode of the source side select transistor SSTr.

The back gate transistor BGTr is configured by the joining portion JP, the ONO layer NL (the charge storage layer EC), and the back gate line BG. An edge portion of the back gate line BG in contact with the ONO layer NL functions as a control gate electrode of the back gate transistor BGTr.

(Specific Configuration of the Nonvolatile Semiconductor Memory Device 100 in Accordance with the First Embodiment)

Figure 5:
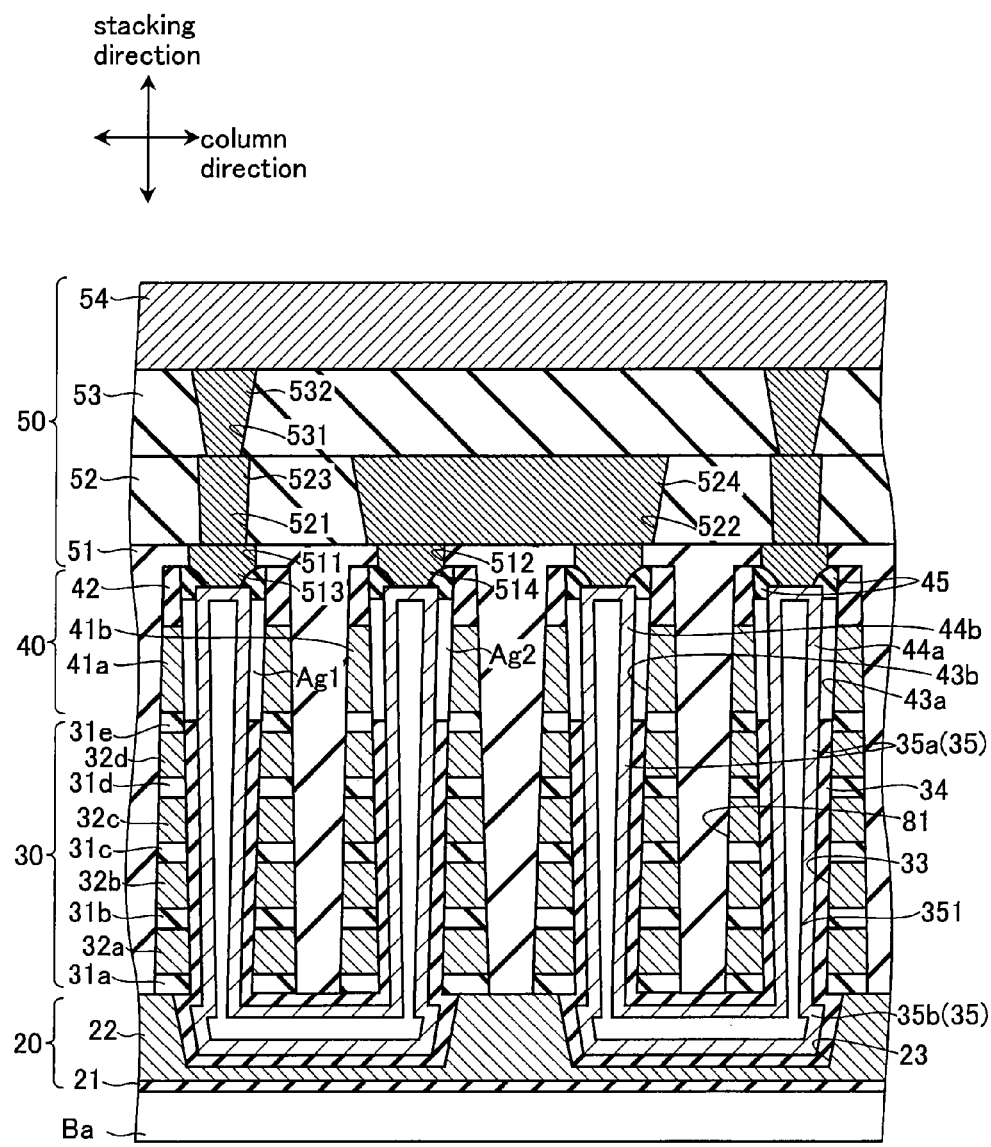
FIG. 5 is a cross-sectional view of the memory transistor region 12 of the nonvolatile semiconductor memory device 100 in accordance with the first embodiment.

Next, a specific configuration of the nonvolatile semiconductor memory device 100 in accordance with the first embodiment is described with reference to FIG. 5. FIG. 5 is a cross-sectional view of the memory transistor region 12 of the nonvolatile semiconductor memory device 100 in accordance with the first embodiment.

The memory transistor region 12 includes, sequentially, from the semiconductor substrate Ba in the stacking direction, a back gate transistor layer 20, a memory transistor layer 30, a select transistor layer 40, and a wiring layer 50, as shown in FIG. 5. The back gate transistor layer 20 functions as the aforementioned back gate transistor BGTr. The memory transistor layer 30 functions as the aforementioned memory transistors MTr1-MTr8. The select transistor layer 40 functions as the aforementioned source side select transistor SSTr and drain side select transistor SDTr.

The back gate transistor layer 20 includes a back gate insulating layer 21 and a back gate conductive layer 22 that are sequentially stacked on the semiconductor substrate Ba. The back gate insulating layer 21 and the back gate conductive layer 22 are formed so as to extend in the column direction and the row direction. The back gate insulating layer 21 and the back gate conductive layer 22 are segmented into predetermined regions (erase units).

The back gate conductive layer 22 is formed covering a lower surface and a side surface of a joining portion 35b of a hereafter-described U-shaped semiconductor layer 35, and to a same height as an upper surface of the joining portion 35b.

The back gate insulating layer 21 is constituted by silicon oxide ($SiO_2$). The back gate conductive layer 22 is constituted by polysilicon (p—Si).

In addition, the back gate transistor layer 20 includes back gate holes 23 formed so as to dig out the back gate conductive layer 22. Each of the back gate holes 23 is configured to have an opening that is short in the row direction and long in the column direction. The back gate holes 23 are formed at predetermined intervals in the row direction and the column direction. That is to say, the back gate holes 23 are formed in a matrix in a plane that includes the row direction and the column direction.

The memory transistor layer 30 includes first through fifth inter-word line insulating layers 31a-31e, and first through fourth word line conductive layers 32a-32d, the layers 31a-31e, 32a-32d being alternately stacked above the back gate conductive layer 22.

The first through fifth inter-word line insulating layers 31a-31e and the first through fourth word line conductive layers 32a-32d are formed in a repeating manner in lines extending in the row direction and having a predetermined spacing in the column direction. The first through fifth inter-word line insulating layers 31a-31e and the first through fourth word line conductive layers 32a-32d are shaped into a stepped shape at ends in the row direction.

The first through fifth inter-word line insulating layers 31a-31e are constituted by silicon oxide ($SiO_2$). The first through fourth word line conductive layers 32a-32d are constituted by polysilicon (p—Si).

The memory transistor layer 30 includes memory holes 33 and trenches 81, each of which is formed so as to pass through the first through fifth inter-word line insulating layers 31a-31e and the first through fourth word line conductive layers 32a-32d. The memory holes 33 are formed so as to align with a position of a vicinity of both ends in the column direction of each of the back gate holes 23. The trenches 81 are formed so as to extend downwardly from the select transistor layer 40 that is an upper layer. The trenches 81 are formed between the memory holes 33 lined up in the column direction. The trenches 81 are formed so as to extend in the row direction.

In addition, the above-described back gate transistor layer 20 and the memory transistor layer 30 include a memory gate insulating layer 34 and the U-shaped semiconductor layer 35.

The memory gate insulating layer 34 is formed on a side wall facing the memory holes 33 and a side wall facing the back gate holes 23.

The U-shaped semiconductor layer 35 is formed in a U shape viewed from the row direction. The U-shaped semiconductor layer 35 is formed so as to be in contact with the memory gate insulating layer 34 and so as to fill the back gate hole 23 and the memory holes 33. The U-shaped semiconductor layer 35 includes a pair of columnar portions 35a extending in a perpendicular direction with respect to the semiconductor substrate Ba viewed from the row direction, and a joining portion 35b formed so as to join lower ends of the pair of columnar portions 35a. The U-shaped semiconductor layer 35 includes a hollow 351 in an interior portion thereof.

The memory gate insulating layer 34 is constituted by silicon oxide ($SiO_2$)-silicon nitride (charge storage layer) (SiN)-silicon oxide ($SiO_2$). The U-shaped semiconductor layer 35 is constituted by polysilicon (p—Si).

In an above-described configuration of the back gate transistor layer 20 and the memory transistor layer 30, the back gate conductive layer 22 functions as a gate of the back gate transistor BGTr. The back gate conductive layer 22 functions as the back gate line BG. The first through fourth word line conductive layers 32a-32d function as gates of the memory transistors MTr1-MTr8. The first through fourth word line conductive layers 32a-32d function as the word lines WL1-WL8.

The select transistor layer 40 includes a drain side conductive layer 41a and a source side conductive layer 41b deposited on the memory transistor layer 30, and a select transistor insulating layer 42. The drain side conductive layer 41a, the source side conductive layer 41b and the select transistor insulating layer 42 are formed in a repeating manner in lines (stripes) extending in the row direction and having a predetermined spacing in the column direction.

The drain side conductive layer 41a is formed extending in the row direction and having a predetermined pitch in the column direction. Similarly, the source side conductive layer 41b is formed extending in the row direction and having a predetermined pitch in the column direction. A pair of the drain side conductive layers 41a and a pair of the source side conductive layers 41b are formed alternately in the column direction. The select transistor insulating layer 42 is formed above the drain side conductive layer 41a and the source side conductive layer 41b formed as described above.

The drain side conductive layer 41a and the source side conductive layer 41b are constituted by polysilicon (p—Si) doped with boron (B) (P+ type semiconductor). The select transistor insulating layer 42 is constituted by silicon oxide ($SiO_2$).

In addition, the select transistor layer 40 includes drain side holes 43a, source side holes 43b, and the trenches 81.

Each of the drain side holes 43a is formed so as to pass through the select transistor insulating layer 42 and the drain side conductive layer 41a. Each of the source side holes 43b is formed so as to pass through the select transistor insulating layer 42 and the source side conductive layer 41b. The drain side holes 43a and the source side holes 43b are formed continuously in an integrated manner with the memory holes 33. The trenches 81 are formed continuously onto the above-mentioned trenches 81 of the memory transistor layer 30. The trenches 81 are formed so as to separate between the drain side conductive layer 41a and the source side conductive layer 41b. That is to say, the trenches 81 are formed so as to pass through the select transistor insulating layer 42 and the drain side conductive layer 41a (the source side conductive layer 41b).

In addition, the select transistor layer 40 includes a drain side columnar semiconductor layer 44a, a source side columnar semiconductor layer 44b, and an upper insulating layer 45.

Figure 6:
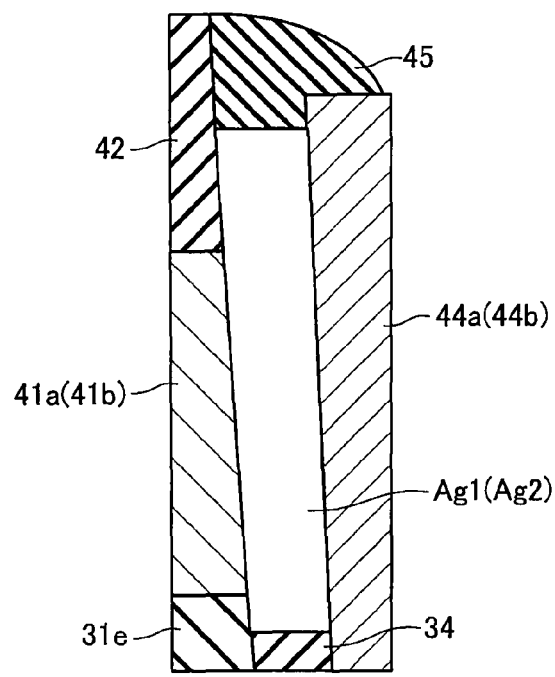
FIG. 6 is a partial enlarged view of FIG. 5.

The drain side columnar semiconductor layer 44a is formed within the drain side hole 43a. The drain side columnar semiconductor layer 44a is formed so as to extend from one of upper surfaces of the U-shaped semiconductor layer 35. The drain side columnar semiconductor layer 44a is formed continuously in an integrated manner with the U-shaped semiconductor layer 35. The drain side columnar semiconductor layer 44a has the hollow 351 continuing from the U-shaped semiconductor layer 35. That is to say, the hollow 351 is formed from the U-shaped semiconductor layer 35 through to the drain side columnar semiconductor layer 44a. The aforementioned drain side conductive layer 41a is here formed with a gap Ag1 from the drain side columnar semiconductor layer 44a, as shown in FIG. 6.

The source side columnar semiconductor layer 44b is formed within the source side hole 43b. The source side columnar semiconductor layer 44b is formed so as to extend from another of the upper surfaces of the U-shaped semiconductor layer 35. The source side columnar semiconductor layer 44b is formed continuously in an integrated manner with the U-shaped semiconductor layer 35. The source side columnar semiconductor layer 44b has the hollow 351 continuing from the U-shaped semiconductor layer 35. That is to say, the hollow 351 is formed from the U-shaped semiconductor layer 35 through to the source side columnar semiconductor layer 44b. The aforementioned source side conductive layer 41b is here formed with a gap Ag2 from the source side columnar semiconductor layer 44b, as shown in FIG. 6.

The upper insulating layer 45 is formed between an upper portion of the select transistor insulating layer 42 and an upper portion of the drain side columnar semiconductor layer 44a (upward of a space formed by the gap Ag1). In addition, the upper insulating layer 45 is formed between an upper portion of the select transistor insulating layer 42 and an upper portion of the source side columnar semiconductor layer 44b (upward of a space formed by the gap Ag2).

The wiring layer 50 includes a first inter-layer insulating layer 51, a second inter-layer insulating layer 52, a third inter-layer insulating layer 53, and a bit line conductive layer 54 that are sequentially stacked above the select transistor insulating layer 42.

The first inter-layer insulating layer 51 is formed to upward of a predetermined height of the select transistor insulating layer 42 and be formed to fill the trenches 81. The first inter-layer insulating layer 51 includes first holes 511 and second holes 512. The first holes 511 and the second holes 512 are formed so as to pass through the first inter-layer insulating layer 51. The first holes 511 are formed at a position aligning with the drain side holes 43a. The second holes 512 are formed at a position aligning with the source side holes 43b.

The first inter-layer insulating layer 51 includes first and second plug layers 513 and 514 formed so as to fill the first and second holes 511 and 512.

The second inter-layer insulating layer 52 is formed above the first inter-layer insulating layer 51. The second inter-layer insulating layer 52 includes third holes 521 and a trench 522. The third holes 521 and the trench 522 are formed so as to pass through the second inter-layer insulating layer 52. The third holes 521 are formed at a position aligning with the first holes 511. The trench 522 is formed such that a pair of the second holes 512 adjacent in the column direction are situated at a lower surface thereof. The trench 522 is formed so as to extend in the row direction.

The second inter-layer insulating layer 52 includes third plug layers 523 formed so as to fill the third holes 521. The second inter-layer insulating layer 52 includes a source line conductive layer 524 formed so as to fill the trench 522.

The third inter-layer insulating layer 53 is formed above the second inter-layer insulating layer 52. The third inter-layer insulating layer 53 includes fourth holes 531. The fourth holes 531 are formed so as to pass through the third inter-layer insulating layer 53. The fourth holes 531 are formed at a position aligning with the third holes 521.

The third inter-layer insulating layer 53 includes fourth plug layers 532 formed so as to fill the fourth holes 531.

The bit line conductive layer 54 is formed extending in the column direction and having a predetermined pitch in the row direction.

The first through third inter-layer insulating layers 51-53 are constituted by silicon oxide ($SiO_2$). The first through fourth plug layers 513, 514, 523 and 532, the source line conductive layer 524, and the bit line conductive layer 54 are constituted by titanium (Ti)-titanium nitride (TiN)-tungsten (W).

In the above-described wiring layer 50, the bit line conductive layer 54 functions as the bit line BL. The source line conductive layer 524 functions as the source line SL.

(Method of Manufacturing the Nonvolatile Semiconductor Memory Device 100 in Accordance with the First Embodiment)

Next, a method of manufacturing the nonvolatile semiconductor memory device 100 in accordance with the first embodiment is described with reference to FIGS. 7-18. FIGS. 7-18 are cross-sectional views showing manufacturing processes of the nonvolatile semiconductor memory device 100 in accordance with the first embodiment.

Figure 7:
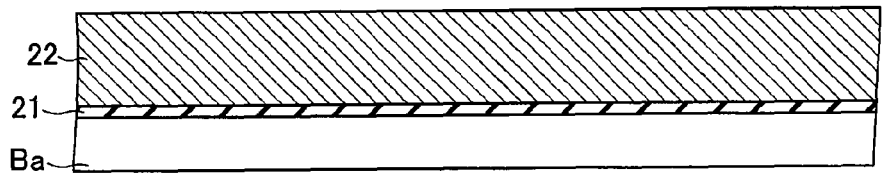
FIG. 7 is a cross-sectional view showing a manufacturing process of the nonvolatile semiconductor memory device 100 in accordance with the first embodiment.

First, silicon oxide (SiO$_2$) and polysilicon (p—Si) are deposited on the semiconductor substrate Ba to form the back gate insulating layer 21 and the back gate conductive layer 22, as shown in FIG. 7.

Figure 8:
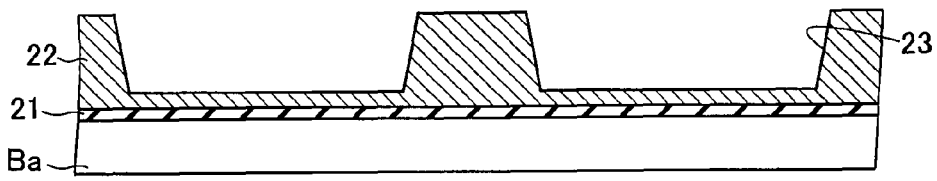
FIG. 8 is a cross-sectional view showing a manufacturing process of the nonvolatile semiconductor memory device 100 in accordance with the first embodiment.

Next, the back gate conductive layer 22 is dug out using methods of lithography or RIE (Reactive Ion Etching) to form the back gate holes 23, as shown in FIG. 8.

Figure 9:
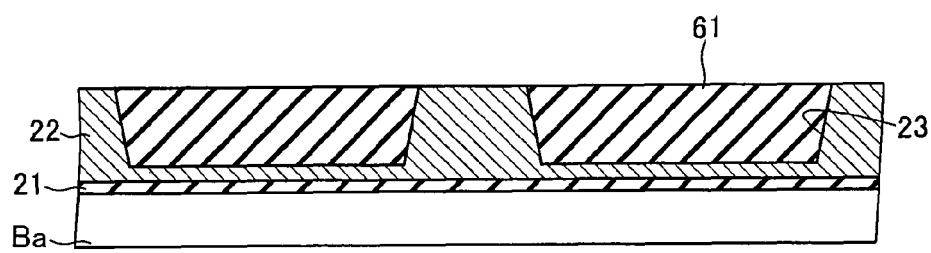
FIG. 9 is a cross-sectional view showing a manufacturing process of the nonvolatile semiconductor memory device 100 in accordance with the first embodiment.

Then, silicon nitride is deposited so as to fill the back gate holes 23, thereby forming sacrifice layers 61, as shown in FIG. 9.

Figure 10:
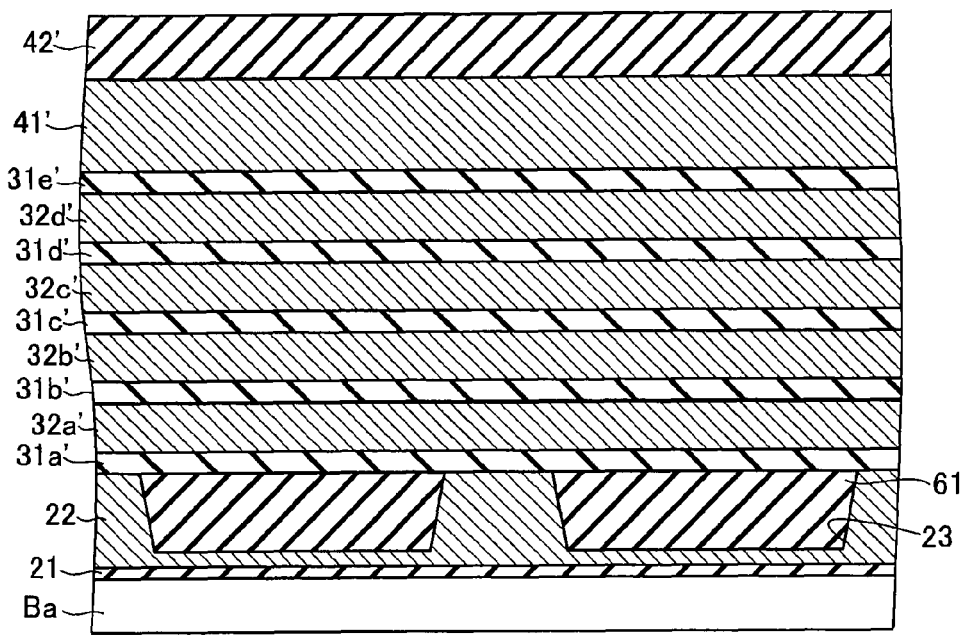
FIG. 10 is a cross-sectional view showing a manufacturing process of the nonvolatile semiconductor memory device 100 in accordance with the first embodiment.

Next, silicon oxide (SiO$_2$) and polysilicon (p—Si) are alternately deposited on the back gate conductive layer 22 and the sacrifice layers 61 to form first through fifth insulating layers 31a'-31e' and first through fourth conductive layers 32a'-32d', as shown in FIG. 10. In addition, silicon oxide (SiO$_2$) and polysilicon (p—Si) are stacked on an upper portion of the fifth insulating layer 31e' to form a conductive layer 41' and an insulating layer 42'. Here, the above-described first through fifth insulating layers 31a'-31e' become the first through fifth inter-word line insulating layers 31a-31e by a process described hereafter; and the first through fourth conductive layers 32a'-32d' become the first through fourth word line conductive layers 32a-32d. In addition, the conductive layer 41' becomes the drain side conductive layer 41a and the source side conductive layer 41b; and the insulating layer 42' becomes the select transistor insulating layer 42.

Figure 11:
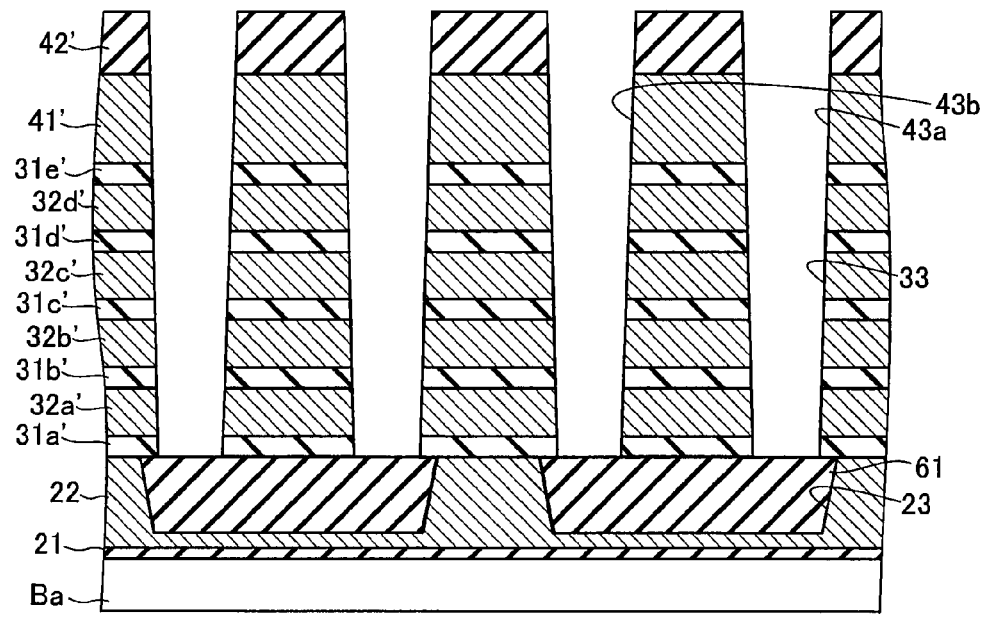
FIG. 11 is a cross-sectional view showing a manufacturing process of the nonvolatile semiconductor memory device 100 in accordance with the first embodiment.

Subsequently, the insulating layer 42', the conductive layer 41', the first through fifth insulating layers 31a'-31e' and the first through fourth conductive layers 32a'-32d' are passed through to form the memory holes 33, as shown in FIG. 11. The memory holes 33 are formed so as to reach an upper surface of both ends in the column direction of the sacrifice layers 61.

Figure 12:
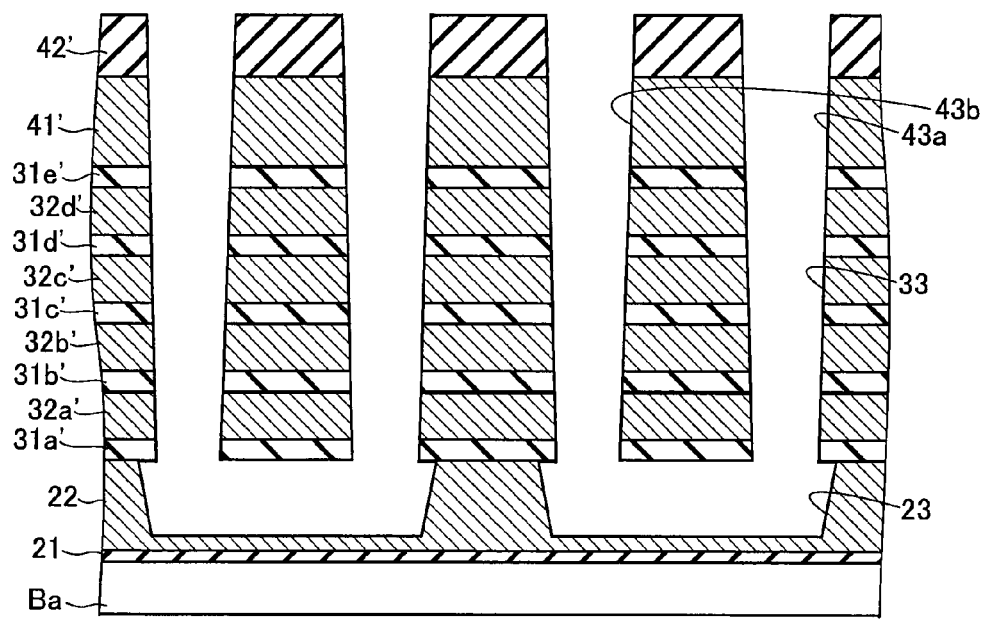
FIG. 12 is a cross-sectional view showing a manufacturing process of the nonvolatile semiconductor memory device 100 in accordance with the first embodiment.

Next, the sacrifice layers 61 are removed with a hot phosphoric acid solution, as shown in FIG. 12.

Figure 13:
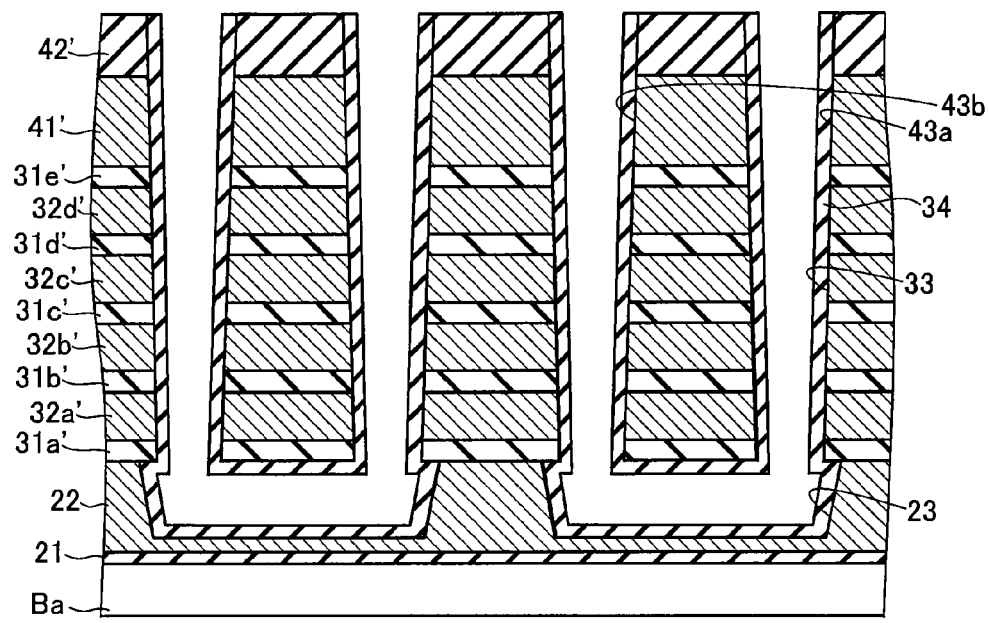
FIG. 13 is a cross-sectional view showing a manufacturing process of the nonvolatile semiconductor memory device 100 in accordance with the first embodiment.

Then, silicon oxide (SiO$_2$) (the block insulating layer), silicon nitride (SiN) (the charge storage layer) and silicon oxide (SiO$_2$) (the tunnel insulating layer) are deposited on a side wall facing the drain side holes 43a, the source side holes 43b, the memory holes 33, and the back gate holes 23 to form the memory gate insulating layer 34, as shown in FIG. 13.

Figure 14:
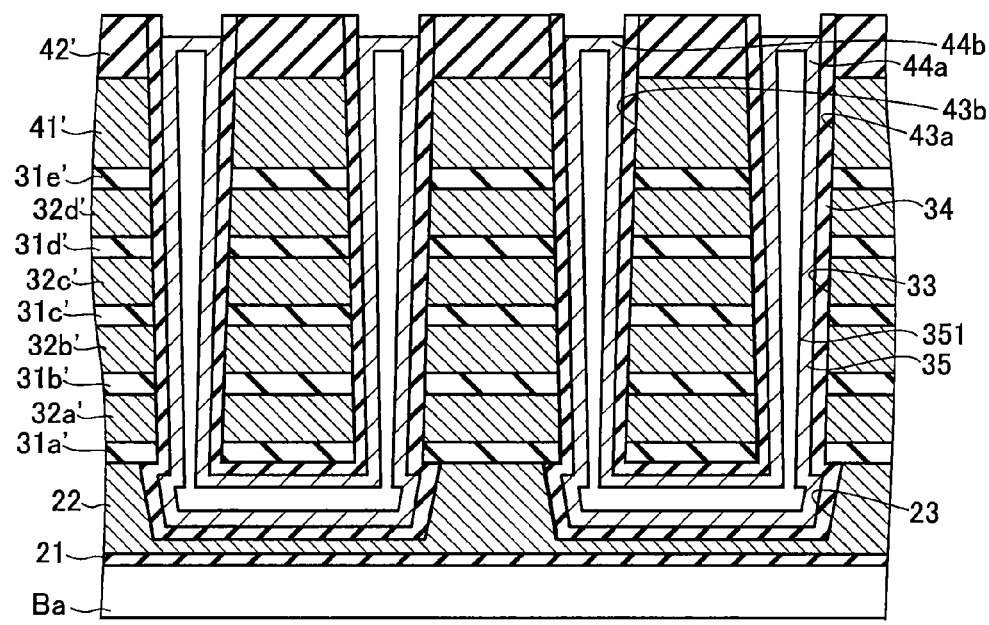
FIG. 14 is a cross-sectional view showing a manufacturing process of the nonvolatile semiconductor memory device 100 in accordance with the first embodiment.

Next, polysilicon (p—Si) is deposited so as to be in contact with the memory gate insulating layer 34 and so as to fill the drain side holes 43a, the source side holes 43b, the memory holes 33, and the back gate holes 23, as shown in FIG. 14. As a result, the U-shaped semiconductor layer 35, the drain side columnar semiconductor layer 44a, and the source side columnar semiconductor layer 44b are formed continuously in an integrated manner. Formed here in the U-shaped semiconductor layer 35, the drain side columnar semiconductor layer 44a, and the source side columnar semiconductor layer 44b is the hollow 351.

Figure 15:
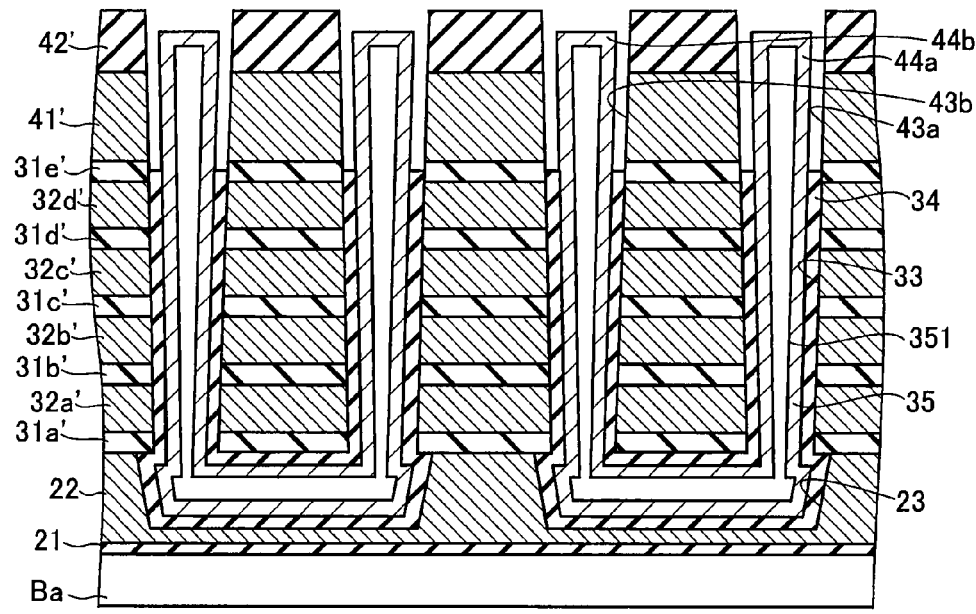
FIG. 15 is a cross-sectional view showing a manufacturing process of the nonvolatile semiconductor memory device 100 in accordance with the first embodiment.

Subsequently, the memory gate insulating layer 34 adjacent to the U-shaped semiconductor layer 35 undergoes etching as far as a same position in the stacking direction as the fifth insulating layer 31e' (a position between the fourth conductive layer 32d' and the conductive layer 41'), as shown in FIG. 15. Specifically, in the first embodiment, silicon oxide (the block insulating layer), silicon nitride (the charge storage layer) and silicon oxide (the tunnel insulating layer) are removed as far as the position between the fourth conductive layer 32d' and the conductive layer 41'.

Figure 16:
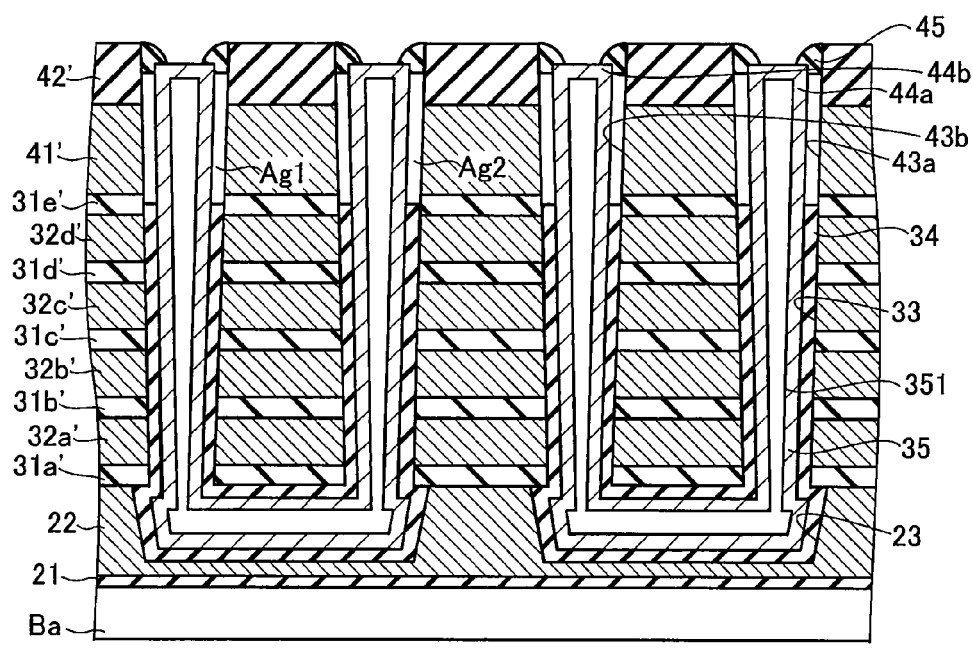
FIG. 16 is a cross-sectional view showing a manufacturing process of the nonvolatile semiconductor memory device 100 in accordance with the first embodiment.

Next, silicon oxide (SiO$_2$) is deposited by a process with a poor filling characteristic (coverage) (for example, plasma CVD, or the like) to form the upper insulating layer 45 between an upper portion of the insulating layer 42' and an upper portion of the drain side columnar semiconductor layer 44a (the source side columnar semiconductor layer 44b), as shown in FIG. 16. The gaps Ag1 and Ag2 are formed in this process.

Figure 17:
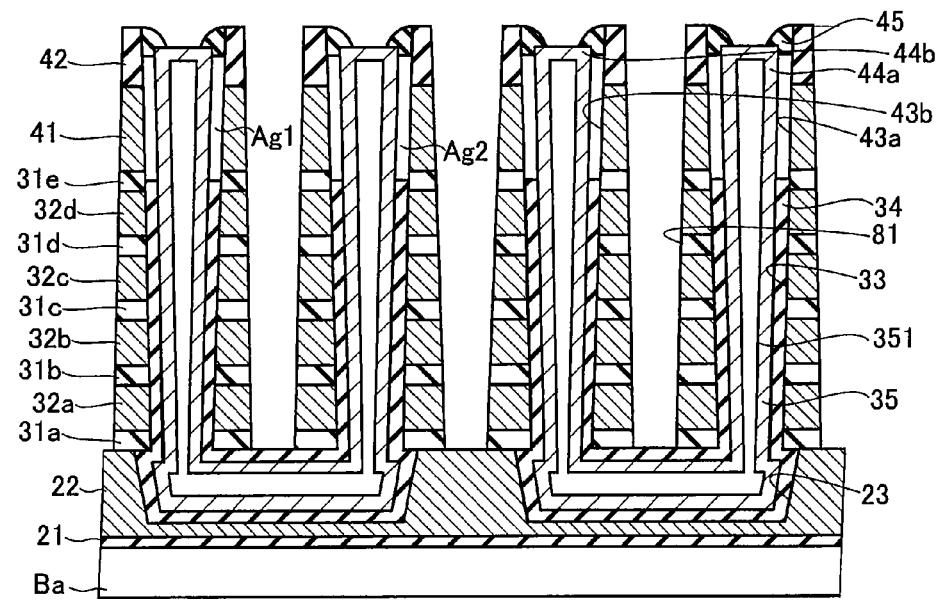
FIG. 17 is a cross-sectional view showing a manufacturing process of the nonvolatile semiconductor memory device 100 in accordance with the first embodiment.

Then, the trenches 81 are formed between the memory holes 33 lined up in the column direction, as shown in FIG. 17. The trenches 81 are formed so as to pass through the first through fifth insulating layers 31a'-31e', the first through fourth conductive layers 32a'-32d', the conductive layer 41', and the insulating layer 42'. The trenches 81 are formed so as to extend in the row direction. Note that through this process, the first through fifth insulating layers 31a'-31e' become the first through fifth inter-word line insulating layers 31a-31e; and the first through fourth conductive layers 32a'-32d' become the first through fourth word line conductive layers 32a-32d. In addition, the conductive layer 41' becomes the drain side conductive layer 41a and the source side conductive layer 41b; and the insulating layer 42' becomes the select transistor insulating layer 42.

Figure 18:
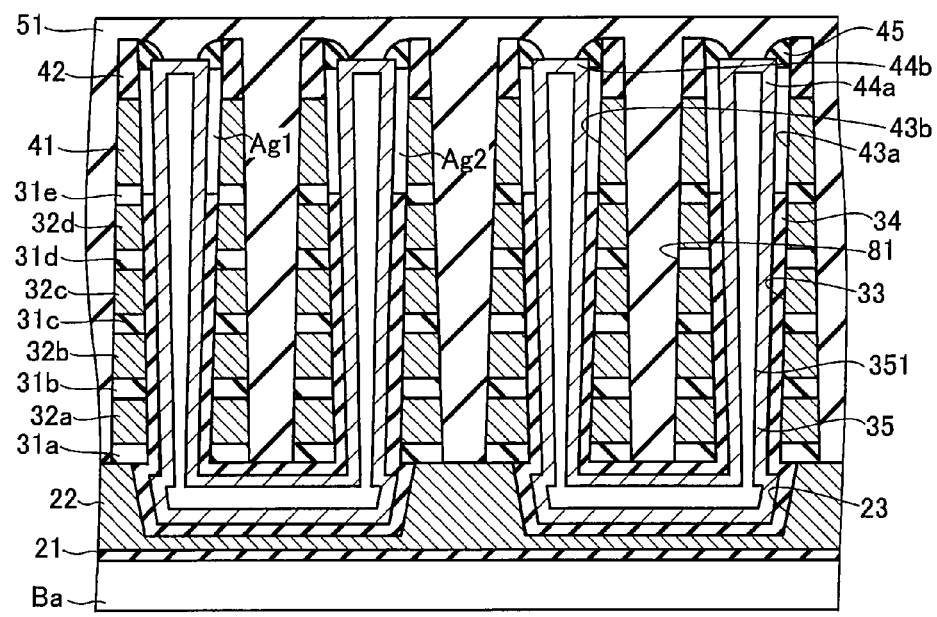
FIG. 18 is a cross-sectional view showing a manufacturing process of the nonvolatile semiconductor memory device 100 in accordance with the first embodiment.

Next, silicon oxide (SiO$_2$) is deposited so as to fill the trenches 81, thereby forming the first inter-layer insulating layer 51, as shown in FIG. 18. Then, subsequent to FIG. 18, the wiring layer 50 is formed, thereby forming the nonvolatile semiconductor memory device 100 in accordance with the first embodiment shown in FIG. 5.

(Effect of the Nonvolatile Semiconductor Memory Device 100 in Accordance with the First Embodiment)

Next, an effect of the nonvolatile semiconductor memory device 100 in accordance with the first embodiment is described. The nonvolatile semiconductor memory device 100 in accordance with the first embodiment is capable of a high degree of integration as shown in the above-described stacked structure.

The U-shaped semiconductor layer 35 and the drain side columnar semiconductor layer 41a (the source side columnar semiconductor layer 41b) in the nonvolatile semiconductor memory device 100 in accordance with the first embodiment are formed continuously in an integrated manner. Consequently, a contact resistance occurring between the memory string MS and the drain side select transistor SDTr (the source side select transistor SSTr) in the nonvolatile semiconductor memory device 100 in accordance with the first embodiment can be suppressed.

The nonvolatile semiconductor memory device 100 in accordance with the first embodiment includes the gap Ag1 functioning as a gate insulating portion of the drain side select transistor SDTr, and the gap Ag2 functioning as a gate insulating portion of the source side select transistor SSTr. Consequently, a gate leak of the drain side select transistor SDTr (the source side select transistor SSTr) arising due to a charge during repeated write and erase in the nonvolatile semiconductor memory device 100 can be suppressed. In addition, there is no trapping of charge in the gaps Ag1 and Ag2. Consequently, in the nonvolatile semiconductor memory device 100, variations in threshold value of the drain side select transistor SDTr (the source side select transistor SSTr) due to charge being trapped in the gate insulating portion can be suppressed. That is to say, reliability in the nonvolatile semiconductor memory device 100 can be maintained.

In order to describe an effect of the method of manufacturing the nonvolatile semiconductor memory device in accordance with the first embodiment, a manufacturing method according to a comparative example that differs from the first embodiment is here considered. In the manufacturing method according to the comparative example, similar processes are effected up to FIG. 14. Now, in the manufacturing method according to the comparative example, the U-shaped semiconductor layer 35 is formed so as not to include the hollow 351. In the manufacturing method according to the comparative example, subsequent to the process of FIG. 14, the drain side columnar semiconductor layer 44a (the source side columnar semiconductor layer 44b) is etched back to downward of the conductive layer 41', and then, the exposed memory gate insulating layer 34 is etched back to downward of the conductive layer 41'. Then, in the manufacturing method according to the comparative example, a drain side gate insulating layer (a source side gate insulating layer) is formed in a side wall of the drain side holes 43a (the source side holes 43b), and the drain side columnar semiconductor layer 44a (the source side columnar semiconductor layer 44b) is once more formed so as to fill the drain side holes 43a (the source side holes 43b).

In contrast, in the method of manufacturing the nonvolatile semiconductor memory device 100 in accordance with the first embodiment, subsequent to the process of FIG. 14, the drain side columnar semiconductor layer 44a (the source side columnar semiconductor layer 44b) is left, and the memory gate insulating layer 34 only is etched back to form the gaps Ag1 and Ag2, as shown in FIG. 15. Consequently, the nonvolatile semiconductor memory device 100 in accordance with the first embodiment can be more easily manufactured than the above-described comparative example.

Second Embodiment (Specific Configuration of a Nonvolatile Semiconductor Memory Device in Accordance with a Second Embodiment)

Figure 19:
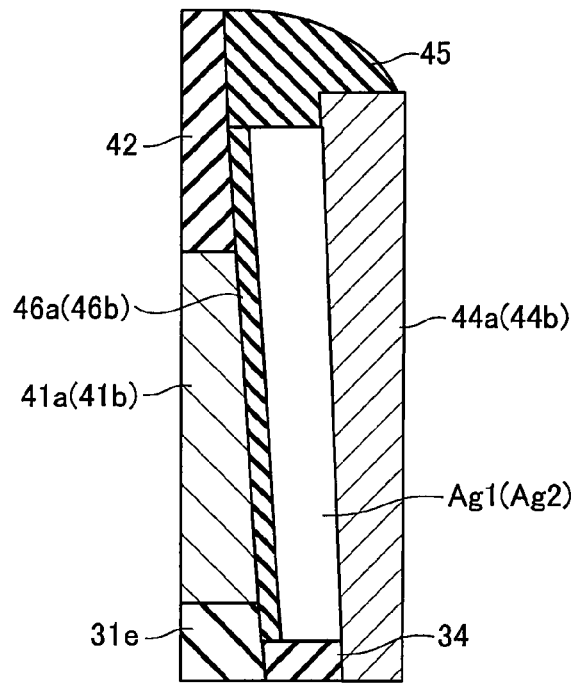
FIG. 19 is an enlarged cross-sectional view of a memory transistor region 12 of a nonvolatile semiconductor memory device in accordance with a second embodiment.

Next, a specific configuration of a nonvolatile semiconductor memory device in accordance with a second embodiment is described with reference to FIG. 19. FIG. 19 is an enlarged cross-sectional view of a memory transistor region 12 of the nonvolatile semiconductor memory device in accordance with the second embodiment. Note that in the second embodiment, identical symbols are assigned to configurations similar to those in the first embodiment and descriptions thereof are omitted.

As shown in FIG. 19, the nonvolatile semiconductor memory device in accordance with the second embodiment differs from the first embodiment in that it further includes a first drain side gate insulating layer 46a in a side wall of the drain side conductive layer 41a facing the gap Ag1. In addition, the nonvolatile semiconductor memory device in accordance with the second embodiment differs from the first embodiment in that it includes a first source side gate insulating layer 46b in a side wall of the source side conductive layer 41b facing the gap Ag2. The first drain side gate insulating layer 46a and the first source side gate insulating layer 46b are constituted by silicon oxide ($SiO_2$).

(Method of Manufacturing the Nonvolatile Semiconductor Memory Device in Accordance with the Second Embodiment)

Next, a method of manufacturing the nonvolatile semiconductor memory device in accordance with the second embodiment is described. In the process shown in FIG. 15 of the first embodiment as it concerns the nonvolatile semiconductor memory device in accordance with the second embodiment, the memory gate insulating layer 34 is formed by etching so as to leave silicon oxide ($SiO_2$) (the block insulating layer) constituting the memory gate insulating layer 34 in the drain side holes 43a. That is to say, only silicon oxide (the tunnel insulating layer) and silicon nitride (the charge storage layer) are removed in the process shown in FIG. 15.

(Effect of the Nonvolatile Semiconductor Memory Device in Accordance with the Second Embodiment)

Next, an effect of the nonvolatile semiconductor memory device in accordance with the second embodiment is described. The nonvolatile semiconductor memory device in accordance with the second embodiment has a configuration substantially similar to that of the first embodiment. Consequently, the nonvolatile semiconductor memory device in accordance with the second embodiment displays a similar effect to that of the first embodiment.

Furthermore, the nonvolatile semiconductor memory device in accordance with the second embodiment differs from the first embodiment in being provided with the first drain side gate insulating layer 46a and the first source side gate insulating layer 46b. Consequently, in the nonvolatile semiconductor memory device in accordance with the second embodiment, thermal diffusion of impurities included in the drain side conductive layer 41a and the source side conductive layer 41b can be suppressed by the first drain side gate insulating layer 46a and the first source side gate insulating layer 46b. In addition, contamination of silicon (S) constituting the drain side columnar semiconductor layer 44a (the source side columnar semiconductor layer 44b) due to airborne outward diffusion can be prevented by the first drain side gate insulating layer 46a and the first source side gate insulating layer 46b. Accordingly, in the nonvolatile semiconductor memory device in accordance with the second embodiment, variations and variability in the threshold voltage of the drain side select transistor SDTr (the source side select transistor SSTr) due to the above-described contamination can be suppressed. That is to say, the nonvolatile semiconductor memory device in accordance with the second embodiment enables reliability to be improved even more than the first embodiment.

Third Embodiment (Specific Configuration of a Nonvolatile Semiconductor Memory Device in Accordance with a Third Embodiment)

Figure 20:
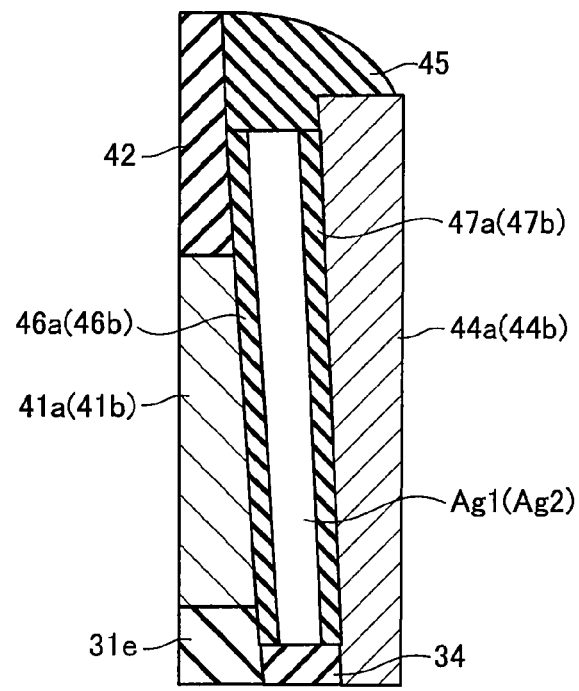
FIG. 20 is an enlarged cross-sectional view of a memory transistor region 12 of a nonvolatile semiconductor memory device in accordance with a third embodiment.

Next, a specific configuration of a nonvolatile semiconductor memory device in accordance with a third embodiment is described with reference to FIG. 20. FIG. 20 is an enlarged cross-sectional view of a memory transistor region 12 of the nonvolatile semiconductor memory device in accordance with the third embodiment. Note that in the third embodiment, identical symbols are assigned to configurations similar to those in the first and second embodiments and descriptions thereof are omitted.

As shown in FIG. 20, the nonvolatile semiconductor memory device in accordance with the third embodiment further includes, in addition to the configuration according to the second embodiment, a second drain side gate insulating layer 47a in a side wall of the drain side columnar semiconductor layer 44a facing the gap Ag1. Moreover, the nonvolatile semiconductor memory device in accordance with the third embodiment further includes, in addition to the configuration according to the second embodiment, a second source side gate insulating layer 47b in a side wall of the source side columnar semiconductor layer 44b facing the gap Ag2. The second drain side gate insulating layer 47a and the second source side gate insulating layer 47b are constituted by silicon oxide ($SiO_2$).

(Method of Manufacturing the Nonvolatile Semiconductor Memory Device in Accordance with the Third Embodiment)

Next, a method of manufacturing the nonvolatile semiconductor memory device in accordance with the third embodiment is described. The nonvolatile semiconductor memory device in accordance with the third embodiment is formed by thermally oxidizing polysilicon (p—Si) constituting the drain side columnar semiconductor layer 44*a* (the source side columnar semiconductor layer 44*b*), in addition to the manufacturing processes of the second embodiment.

(Effect of the Nonvolatile Semiconductor Memory Device in Accordance with the Third Embodiment)

Next, an effect of the nonvolatile semiconductor memory device in accordance with the third embodiment is described. The nonvolatile semiconductor memory device in accordance with the third embodiment has a configuration substantially similar to that of the first embodiment. Consequently, the nonvolatile semiconductor memory device in accordance with the third embodiment displays a similar effect to that of the first embodiment.

Furthermore, the nonvolatile semiconductor memory device in accordance with the third embodiment is provided with the second drain side gate insulating layer 47*a* and the second source side gate insulating layer 47*b*. Consequently, in the nonvolatile semiconductor memory device in accordance with the third embodiment, a level of a channel surface can be controlled by the second drain side gate insulating layer 47*a* and the second source side gate insulating layer 47*b*. That is to say, characteristics of the drain side select transistor SDTr and the source side select transistor SSTr in the nonvolatile semiconductor memory device in accordance with the third embodiment can be improved.

Fourth Embodiment (Specific Configuration of a Nonvolatile Semiconductor Memory Device in Accordance with a Fourth Embodiment)

Figure 21:
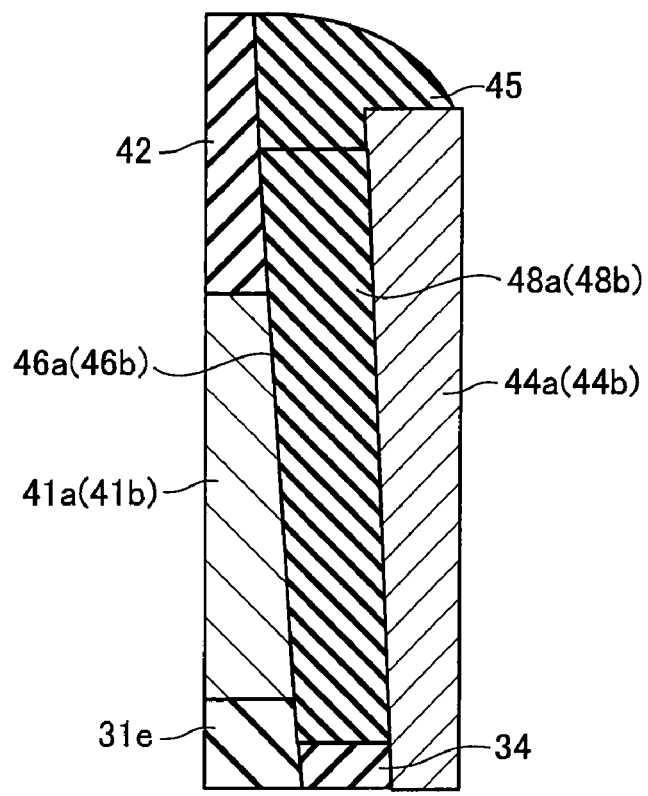
FIG. 21 is an enlarged cross-sectional view of a memory transistor region 12 of a nonvolatile semiconductor memory device in accordance with a fourth embodiment.

Next, a specific configuration of a nonvolatile semiconductor memory device in accordance with a fourth embodiment is described with reference to FIG. 21. FIG. 21 is an enlarged cross-sectional view of a memory transistor region 12 of the nonvolatile semiconductor memory device in accordance with the fourth embodiment. Note that in the fourth embodiment, identical symbols are assigned to configurations similar to those in the first through third embodiments and descriptions thereof are omitted.

As shown in FIG. 21, the nonvolatile semiconductor memory device in accordance with the fourth embodiment differs from a configuration according to the first through third embodiments in including a third drain side gate insulating layer 48*a* formed so as to fill the drain side holes 43*a*. Moreover, the nonvolatile semiconductor memory device in accordance with the fourth embodiment differs from the configuration according to the first through third embodiments in including a third source side gate insulating layer 48*b* formed so as to fill the source side holes 43*b*. That is to say, the nonvolatile semiconductor memory device in accordance with the fourth embodiment differs from the first through third embodiments in not having the gaps Ag1 and Ag2.

(Method of Manufacturing the Nonvolatile Semiconductor Memory Device in Accordance with the Fourth Embodiment)

Next, a method of manufacturing the nonvolatile semiconductor memory device in accordance with the fourth embodiment is described. The nonvolatile semiconductor memory device in accordance with the fourth embodiment differs from the above-described first through third embodiments in being formed so as to fill the drain side holes 43*a* (the source side holes 43*b*) by depositing silicon oxide ($SiO_2$), subsequent to the process shown in FIG. 15 of the first embodiment.

(Effect of the Nonvolatile Semiconductor Memory Device in Accordance with the Fourth Embodiment)

Next, an effect of the nonvolatile semiconductor memory device in accordance with the fourth embodiment is described. The method of manufacturing the nonvolatile semiconductor memory device in accordance with the fourth embodiment displays a substantially similar effect to that of the first embodiment.

Fifth Embodiment (Specific Configuration of a Nonvolatile Semiconductor Memory Device in Accordance with a Fifth Embodiment)

Figure 22:
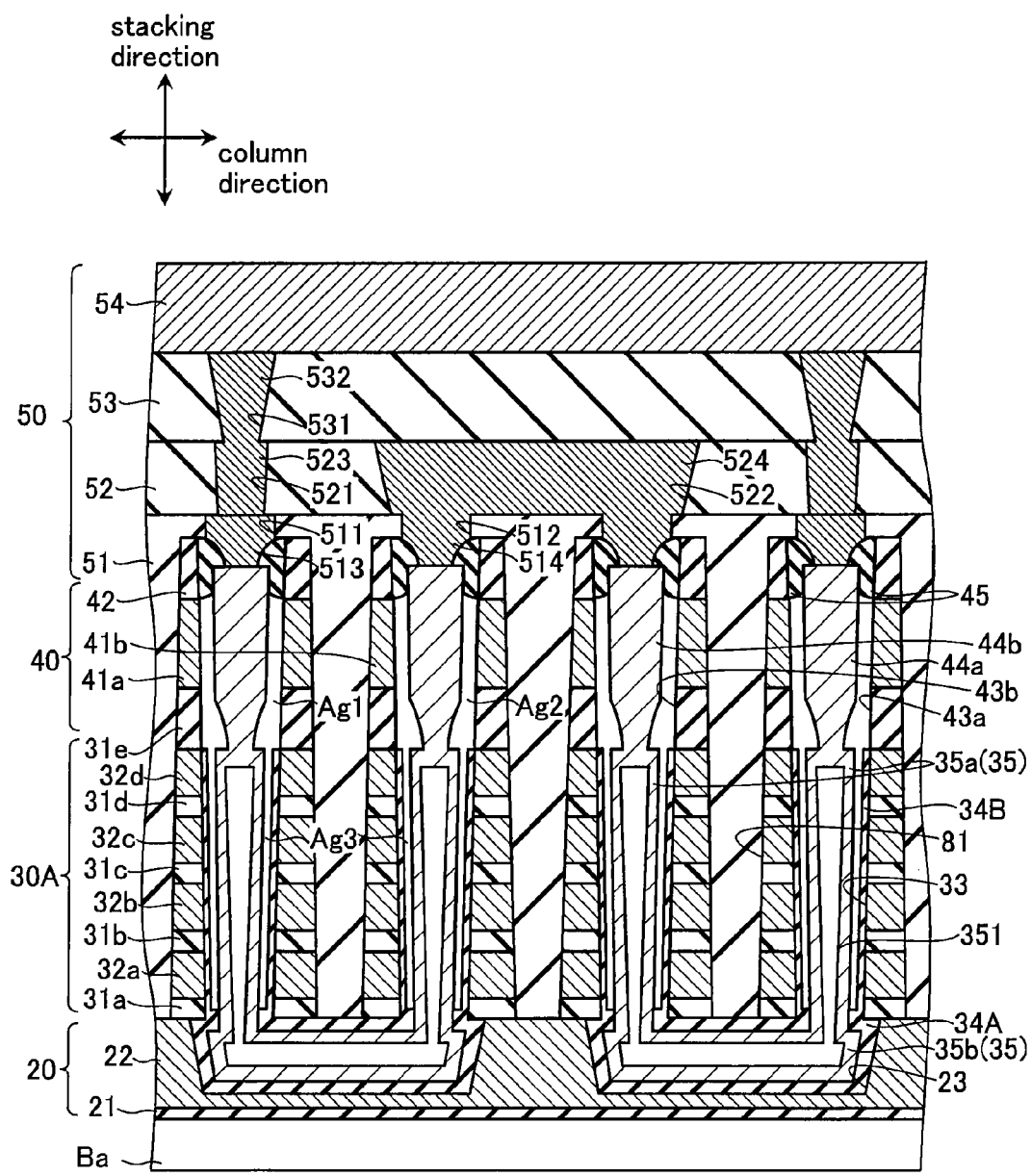
FIG. 22 is a cross-sectional view of a memory transistor region 12 of a nonvolatile semiconductor memory device in accordance with a fifth embodiment.
Figure 23:
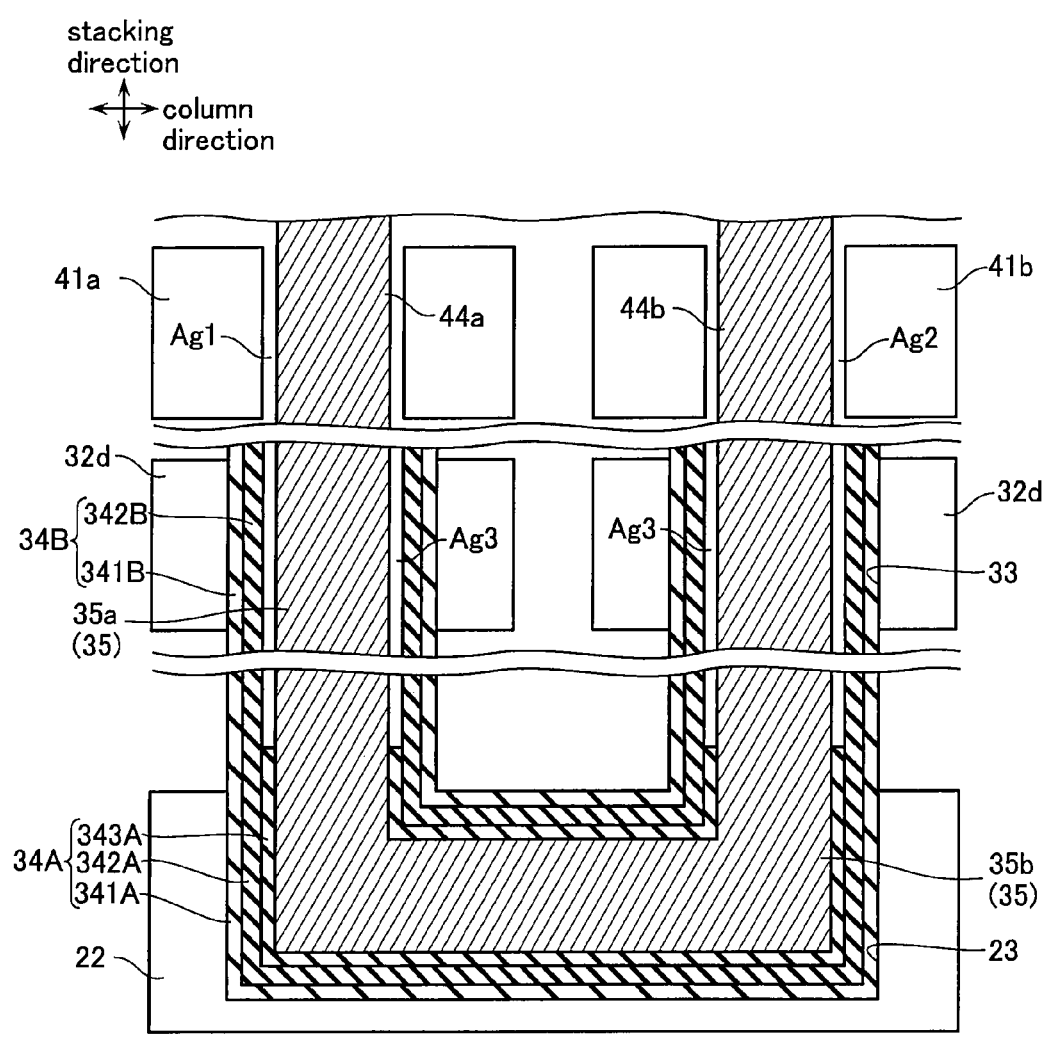
FIG. 23 is an enlarged view of FIG. 22.

Next, a specific configuration of a nonvolatile semiconductor memory device in accordance with a fifth embodiment is described with reference to FIGS. 22 and 23. FIG. 22 is a cross-sectional view of a memory transistor region 12 of the nonvolatile semiconductor memory device in accordance with the fifth embodiment, and FIG. 23 is an enlarged view of FIG. 22. Note that in the fifth embodiment, identical symbols are assigned to configurations similar to those in the first through fourth embodiments and descriptions thereof are omitted.

As shown in FIG. 22, the nonvolatile semiconductor memory device in accordance with the fifth embodiment includes a memory transistor layer 30A that differs from the first through fourth embodiments.

The memory transistor layer 30A includes a first memory gate insulating layer 34A and a second memory gate insulating layer 34B in place of the memory gate insulating layer 34 of the first through fourth embodiments.

The first memory gate insulating layer 34A is formed so as to cover a side surface facing the back gate holes 23, as shown in FIG. 23. The first memory gate insulating layer 34A has a structure in which a block insulating layer 341A, a charge storage layer 342A, and a tunnel insulating layer 343A are stacked from a side of the side surface facing the back gate holes 23. The block insulating layer 341A is formed between the charge storage layer 342A and the back gate conductive layer 22. The tunnel insulating layer 343A is formed between the charge storage layer 342A and the joining portion 35*b*. The block insulating layer 341A and the tunnel insulating layer 343A are constituted by silicon oxide ($SiO_2$). The charge storage layer 342A is constituted by silicon nitride (SiN).

The second memory gate insulating layer 34B is formed so as to cover a side surface facing the memory holes 33, as shown in FIG. 23. The second memory gate insulating layer 34B has a structure in which a block insulating layer 341B and a charge storage layer 342B are stacked from a side of the side surface facing the memory holes 33. The block insulating layer 341B is formed between the charge storage layer 342B and the first through fourth word line conductive layers 32*a*-32*d*. The block insulating layer 341B is constituted by silicon oxide ($SiO_2$). The charge storage layer 342B is constituted by silicon nitride (SiN). That is to say, a gap Ag3 is provided between the second memory gate insulating layer 34B and the U-shaped semiconductor layer 35.

Here, the block insulating layer 341B of the second memory gate insulating layer 34B is formed continuously in an integrated manner with the block insulating layer 341A of the first memory gate insulating layer 34A; and the charge storage layer 342B of the second memory gate insulating layer 34B is formed continuously in an integrated manner with the charge storage layer 342A of the first memory gate insulating layer 34A.

(Method of Manufacturing the Nonvolatile Semiconductor Memory Device in Accordance with the Fifth Embodiment)

Next, a method of manufacturing the nonvolatile semiconductor memory device in accordance with the fifth embodiment is described with reference to FIGS. 24-35. FIGS. 24-35 are cross-sectional views showing manufacturing processes of the nonvolatile semiconductor memory device in accordance with the fifth embodiment. FIG. 26B is an enlarged view of an A portion and a B portion in FIG. 26A. FIG. 27B is an enlarged view of an A portion and a B portion in FIG. 27A. FIG. 28B is an enlarged view of an A portion in FIG. 28A.

Figure 24:
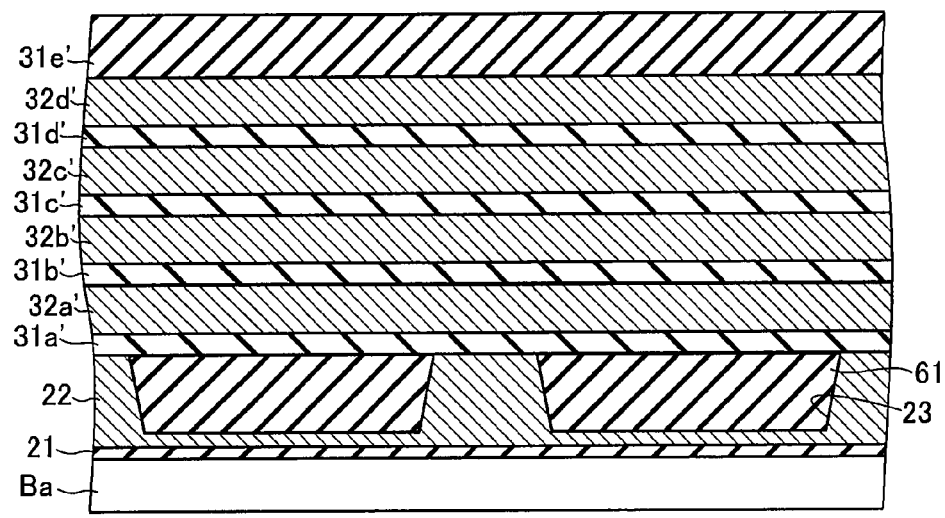
FIG. 24 is a cross-sectional view showing a manufacturing process of the nonvolatile semiconductor memory device in accordance with the fifth embodiment.

First, silicon oxide ($SiO_2$) and polysilicon (p—Si) are alternately deposited on the back gate conductive layer 22 and the sacrifice layers 61 to form the first through fifth insulating layers 31a'-31e' and the first through fourth conductive layers 32a'-32d', as shown in FIG. 24.

Figure 25:
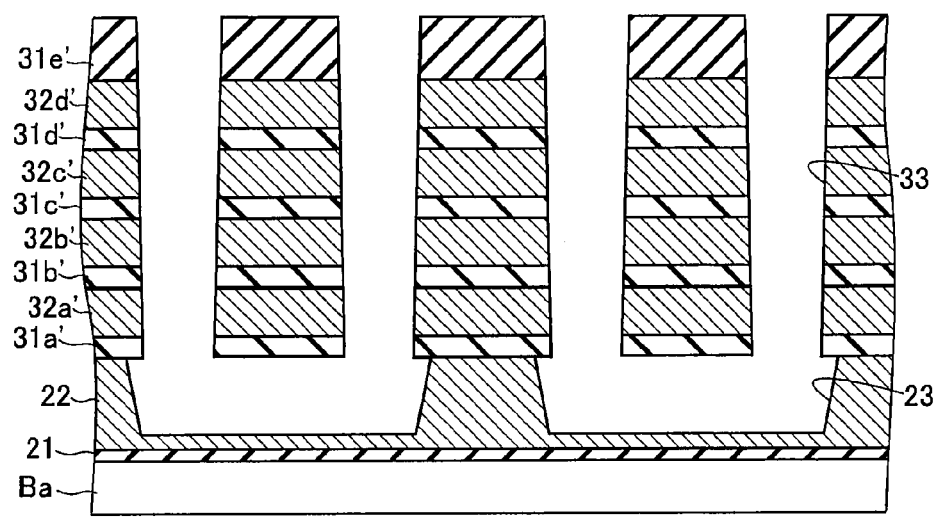
FIG. 25 is a cross-sectional view showing a manufacturing process of the nonvolatile semiconductor memory device in accordance with the fifth embodiment.

Next, as shown in FIG. 25, the memory holes 33 are formed so as to pass through the first through fifth insulating layers 31a'-31e' and the first through fourth conductive layers 32a'-32d', as shown in FIG. 25. Then, the sacrifice layers 61 are removed by hot phosphoric acid treatment.

Figure 26A:
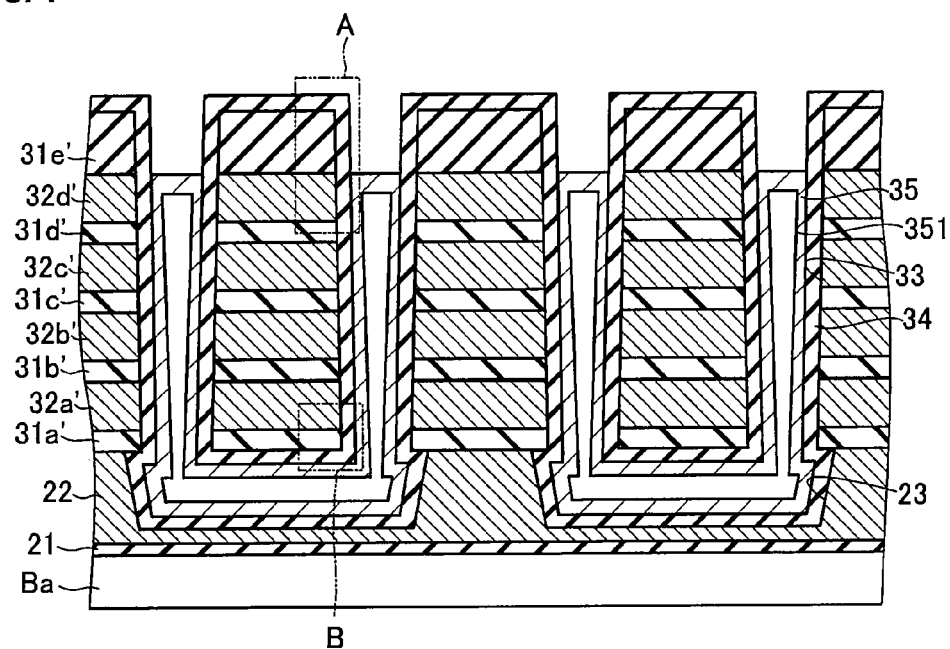
FIG. 26A is a cross-sectional view showing a manufacturing process of the nonvolatile semiconductor memory device in accordance with the fifth embodiment.
Figure 26B:
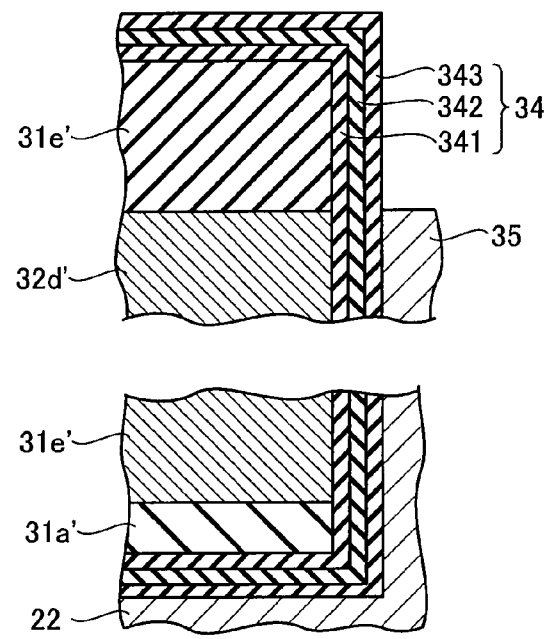
FIG. 26B is an enlarged view of FIG. 26A.

Subsequently, as shown in FIGS. 26A and 26B, silicon oxide ($SiO_2$), silicon nitride (SiN), and silicon oxide ($SiO_2$) are deposited on a side wall of the memory holes 33 and a side wall of the back gate holes 23 to form the memory gate insulating layer 34. Then, polysilicon (p—Si) is deposited so as to be in contact with the memory gate insulating layer 34 and so as to fill the memory holes 33 and the back gate holes 23, thereby forming the U-shaped semiconductor layer 35. The memory gate insulating layer 34 is here configured by a block insulating layer 341, a charge storage layer 342, and a tunnel insulating layer 343, as shown in FIG. 26B.

Figure 27A:
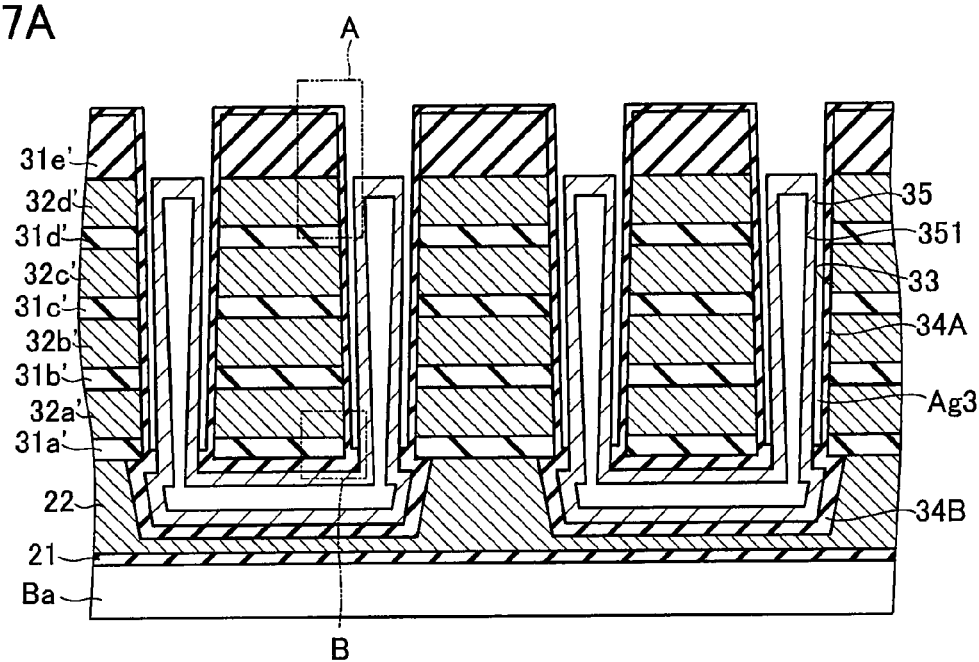
FIG. 27A is a cross-sectional view showing a manufacturing process of the nonvolatile semiconductor memory device in accordance with the fifth embodiment.
Figure 27B:
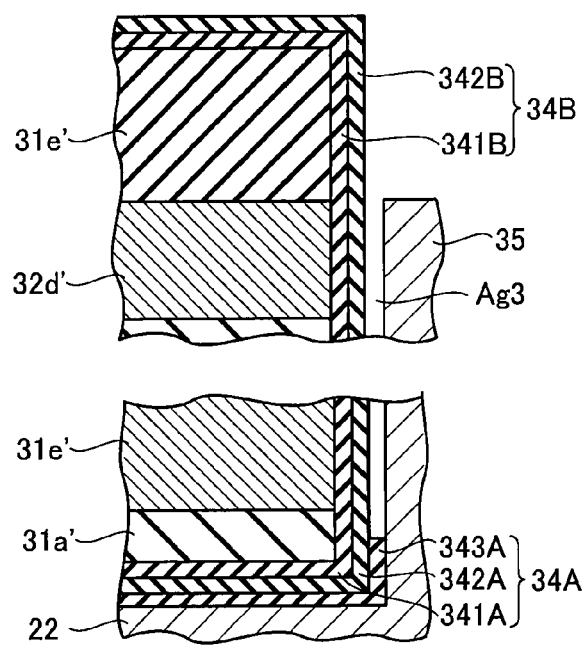
FIG. 27B is an enlarged view of FIG. 27A.

Next, as shown in FIGS. 27A and 27B, the tunnel insulating layer 341 is removed to a height between an upper surface and a lower surface of the first insulating layer 31a'. Through this process, the memory gate insulating layer 34 becomes the first memory gate insulating layer 34A and the second memory gate insulating layer 34B. In addition, the gap Ag3 is formed between the second memory gate insulating layer 34A and the U-shaped semiconductor layer 35.

Figure 28A:
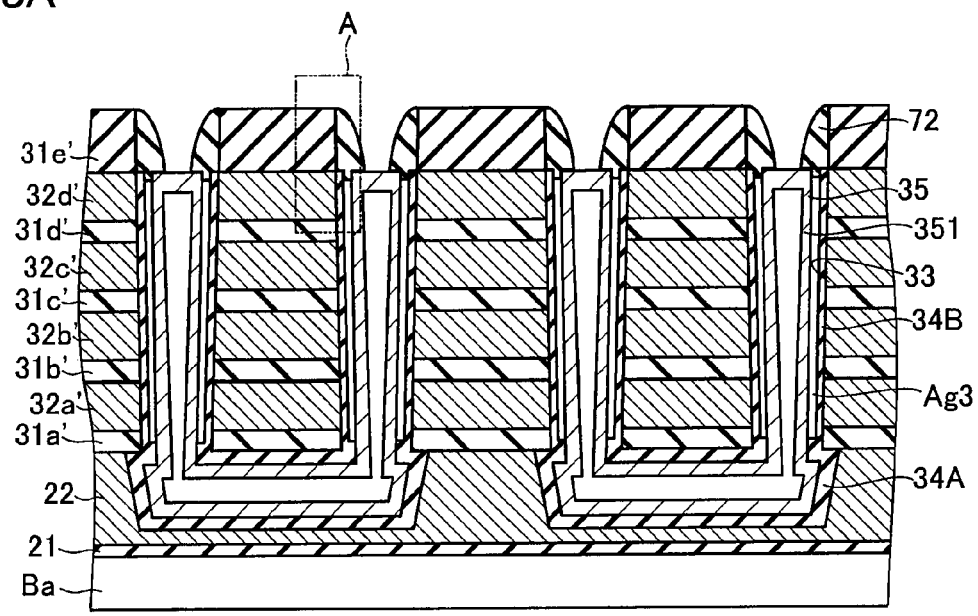
FIG. 28A is a cross-sectional view showing a manufacturing process of the nonvolatile semiconductor memory device in accordance with the fifth embodiment.
Figure 28B:
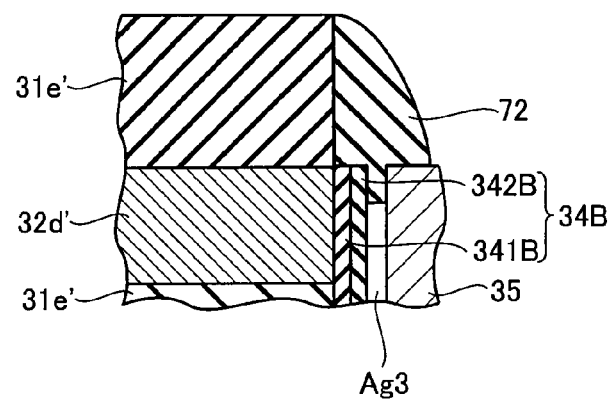
FIG. 28B is an enlarged view of FIG. 28A.

Then, silicon nitride (SiN) is deposited by a process with a poor filling characteristic (coverage) (for example, plasma CVD, or the like) to form sacrifice layers 72, as shown in FIGS. 28A and 28B.

Figure 29:
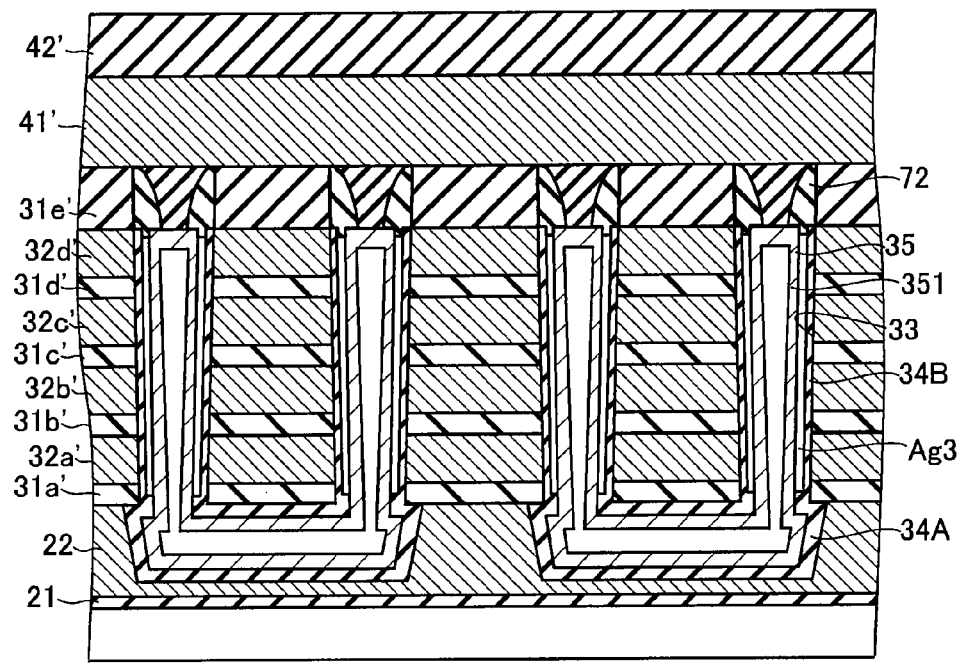
FIG. 29 is a cross-sectional view showing a manufacturing process of the nonvolatile semiconductor memory device in accordance with the fifth embodiment.

Next, polysilicon (p—Si) and silicon oxide ($SiO_2$) are sequentially deposited to form the conductive layer 41' and the insulating layer 42', as shown in FIG. 29.

Figure 30:
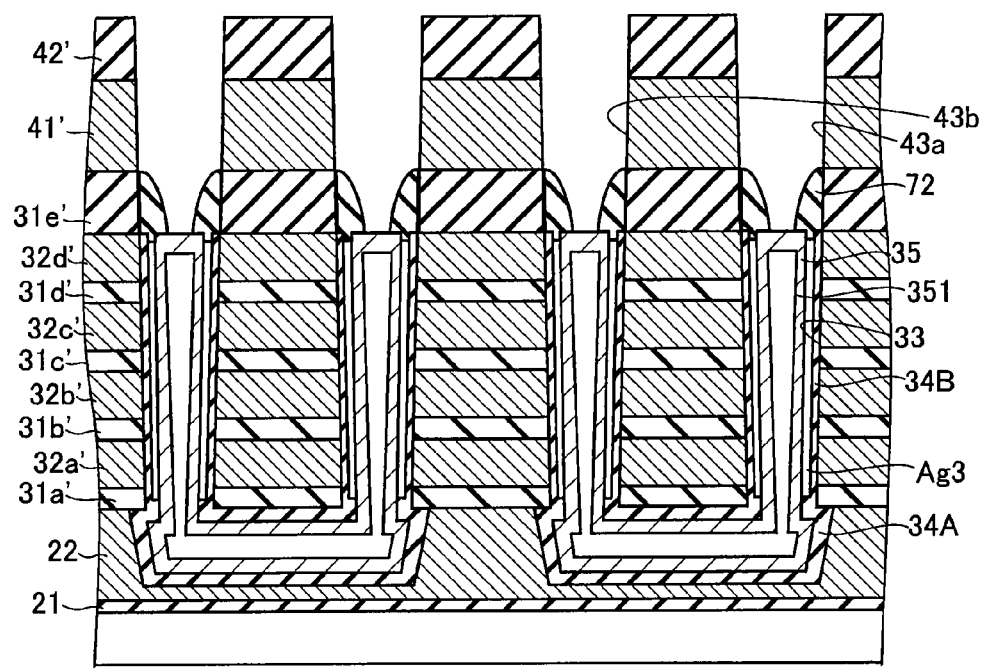
FIG. 30 is a cross-sectional view showing a manufacturing process of the nonvolatile semiconductor memory device in accordance with the fifth embodiment.

Subsequently, the drain side holes 43a (the source side holes 43b) are formed so as to pass through the conductive layer 41' and the insulating layer 42', as shown in FIG. 30. The drain side holes 43a (the source side holes 43b) are formed at a position aligning with the memory holes 33.

Figure 31:
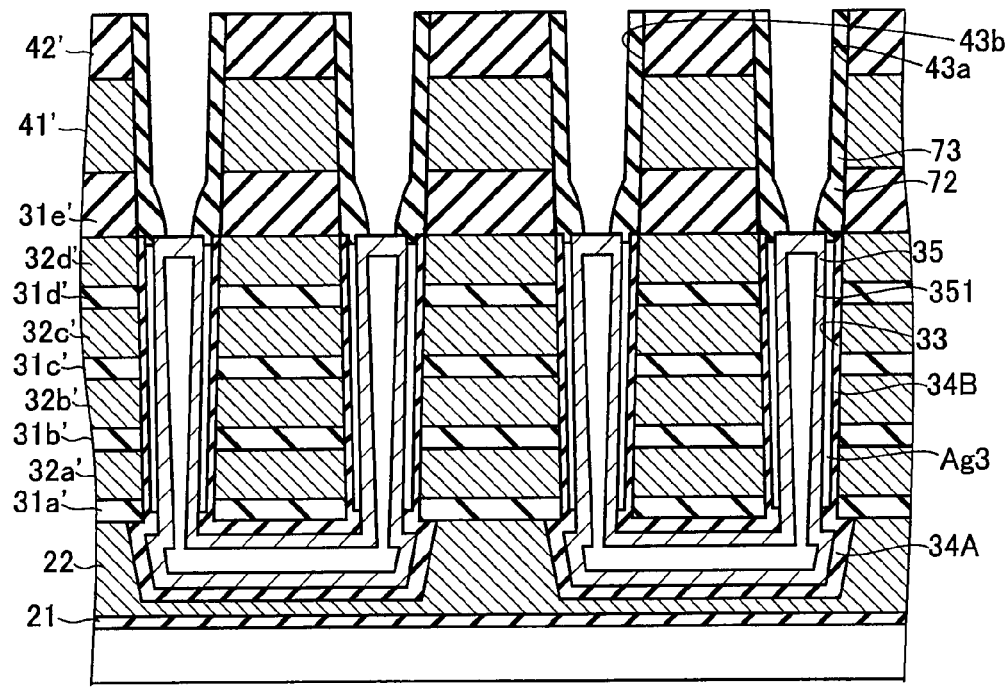
FIG. 31 is a cross-sectional view showing a manufacturing process of the nonvolatile semiconductor memory device in accordance with the fifth embodiment.

Next, silicon nitride (SiN) is deposited to form sacrifice layers 73 in a side wall facing the drain side holes 43a (the source side holes 43b), as shown in FIG. 31.

Figure 32:
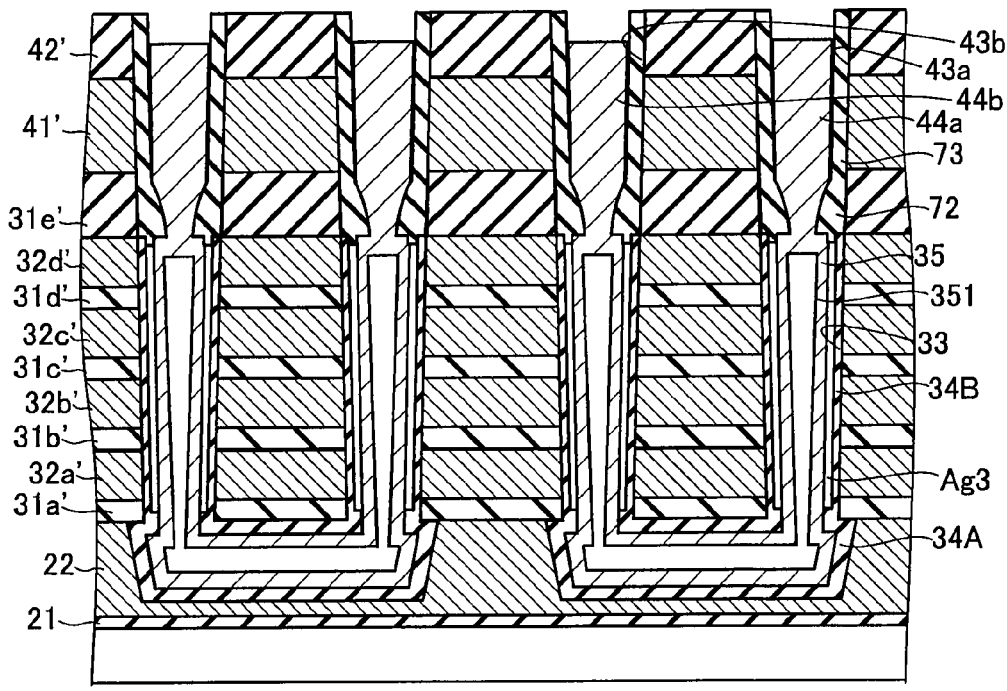
FIG. 32 is a cross-sectional view showing a manufacturing process of the nonvolatile semiconductor memory device in accordance with the fifth embodiment.

Then, as shown in FIG. 32, polysilicon (p—Si) is deposited so as to be in contact with the sacrifice layers 72 and 73, and so as to fill the drain side holes 43a (the source side holes 43b), thereby forming the drain side columnar semiconductor layer 44a (the source side columnar semiconductor layer 44b).

Figure 33:
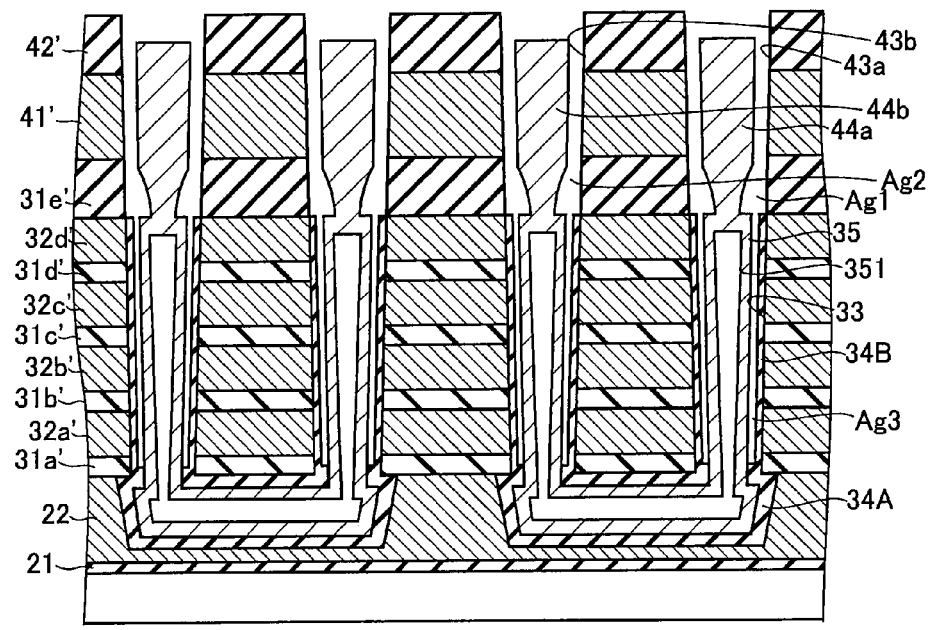
FIG. 33 is a cross-sectional view showing a manufacturing process of the nonvolatile semiconductor memory device in accordance with the fifth embodiment.

Next, the sacrifice layers 72 and 73 are removed by hot phosphoric acid treatment to form the gaps Ag1 and Ag2, as shown in FIG. 33.

Figure 34:
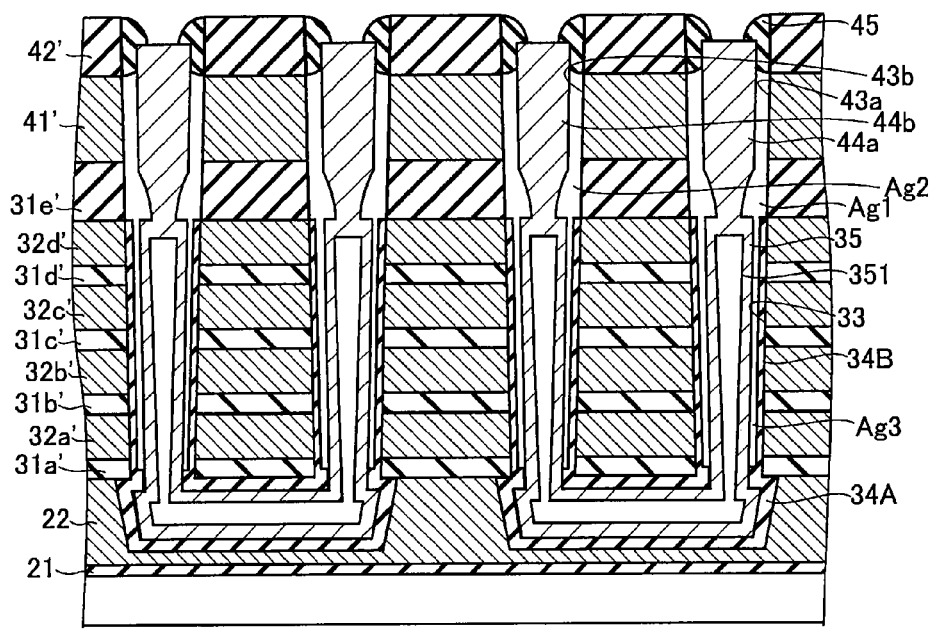
FIG. 34 is a cross-sectional view showing a manufacturing process of the nonvolatile semiconductor memory device in accordance with the fifth embodiment.

Subsequently, silicon oxide ($SiO_2$) is deposited by a process with a poor filling characteristic (coverage) (for example, plasma CVD, or the like) to form the upper insulating layer 45 between an upper portion of the insulating layer 42' and an upper portion of the drain side columnar semiconductor layer 43a (the source side columnar semiconductor layer 43b), as shown in FIG. 34.

Figure 35:
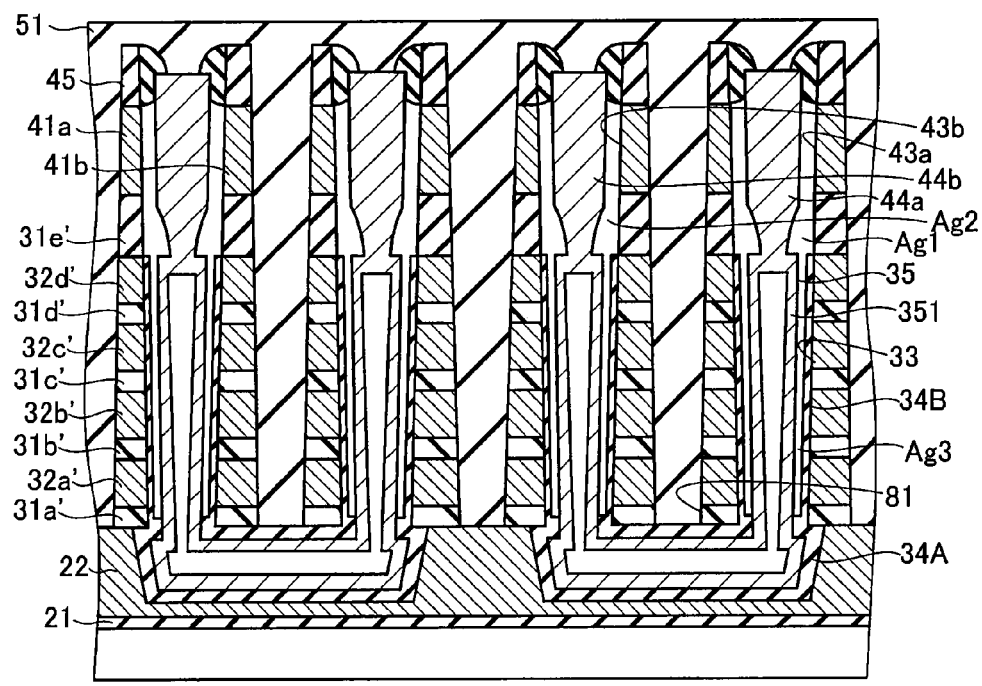
FIG. 35 is a cross-sectional view showing a manufacturing process of the nonvolatile semiconductor memory device in accordance with the fifth embodiment.

Next, the trenches 81 are formed between the memory holes 33 lined up in the column direction, as shown in FIG. 35. The trenches 81 are formed so as to pass through the first through fifth insulating layers 31a'-31e', the first through fourth conductive layers 32a'-32d', the conductive layer 41', and the insulating layer 42'. The trenches 81 are formed so as to extend in the row direction. Note that through this process, the first through fifth insulating layers 31a'-31e' become the first through fifth inter-word line insulating layers 31a-31e; and the first through fourth conductive layers 32a'-32d' become the first through fourth word line conductive layers 32a-32d. In addition, the conductive layer 41' becomes the drain side conductive layer 41a and the source side conductive layer 41b; and the insulating layer 42' becomes the select transistor insulating layer 42.

Additionally, as shown in FIG. 35, silicon oxide ($SiO_2$) is deposited so as to fill the trenches 81, thereby forming the first inter-layer insulating layer 51. Then, subsequent to FIG. 35, the wiring layer 50 is formed, thereby forming the nonvolatile semiconductor memory device in accordance with the fifth embodiment shown in FIG. 22.

(Effect of the Nonvolatile Semiconductor Memory Device in Accordance with the Fifth Embodiment)

Next, an effect of the nonvolatile semiconductor memory device in accordance with the fifth embodiment is described. The nonvolatile semiconductor memory device in accordance with the fifth embodiment includes the gaps Ag1 and Ag2 similarly to the first embodiment. Consequently, the nonvolatile semiconductor memory device in accordance with the fifth embodiment displays a similar effect to that of the first embodiment.

In addition, the nonvolatile semiconductor memory device in accordance with the fifth embodiment includes the gap Ag3. Consequently, the nonvolatile semiconductor memory device in accordance with the fifth embodiment enables tolerance to be raised in comparison with a case where a tunnel insulating layer is formed by silicon oxide ($SiO_2$) in place of the gap Ag3. Moreover, data storage characteristics of the nonvolatile semiconductor memory device in accordance with the fifth embodiment can be improved compared with the above-described tunnel insulating layer.

Sixth Embodiment (Specific Configuration of a Nonvolatile Semiconductor Memory Device in Accordance with a Sixth Embodiment)

Figure 36:
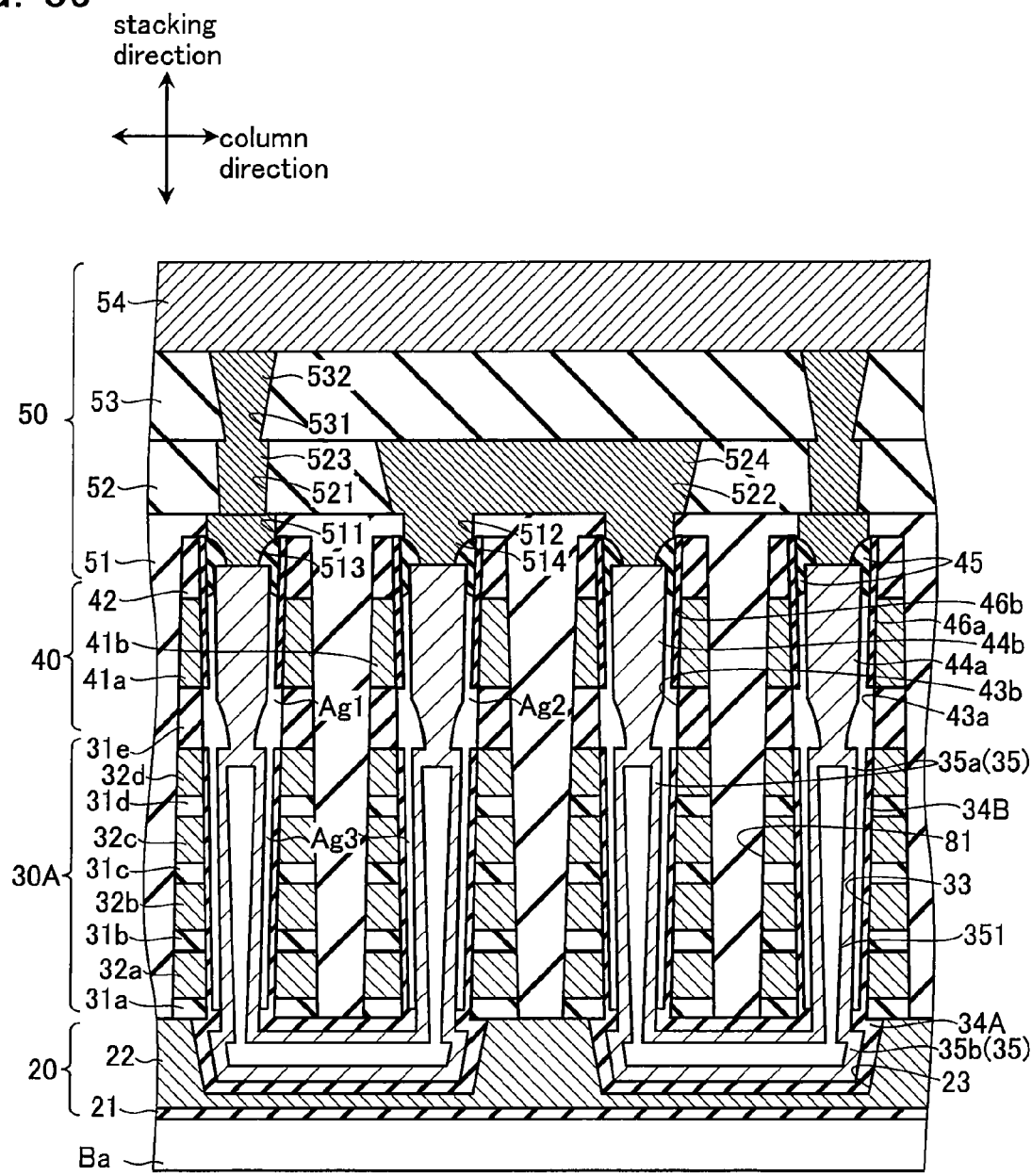
FIG. 36 is a cross-sectional view of a memory transistor region 12 of a nonvolatile semiconductor memory device in accordance with a sixth embodiment.

Next, a specific configuration of a nonvolatile semiconductor memory device in accordance with a sixth embodiment is described with reference to FIG. 36. FIG. 36 is a cross-sectional view of a memory transistor region 12 of the nonvolatile semiconductor memory device in accordance with the sixth embodiment. Note that in the sixth embodiment, identical symbols are assigned to configurations similar to those in the first through fifth embodiments and descriptions thereof are omitted.

As shown in FIG. 36, the nonvolatile semiconductor memory device in accordance with the sixth embodiment includes, in addition to the configuration of the fifth embodiment, the first drain side gate insulating layer 46a and the first source side gate insulating layer 46b. The first drain side gate insulating layer 46a is formed in a side wall of the drain side conductive layer 41a facing the gap Ag1, similarly to the second embodiment. In the same way, the first source side gate insulating layer 46b is formed in a side wall of the source side conductive layer 41b facing the gap Ag2.

(Method of Manufacturing the Nonvolatile Semiconductor Memory Device in Accordance with the Sixth Embodiment)

Figure 37A:
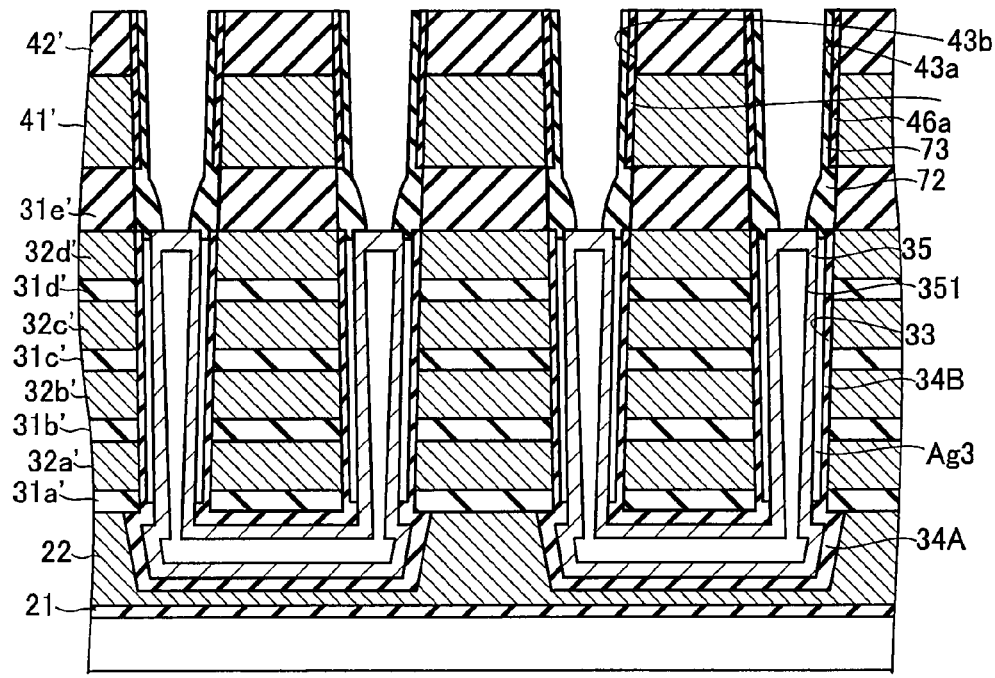
FIG. 37A is a cross-sectional view showing a manufacturing process of the nonvolatile semiconductor memory device in accordance with the sixth embodiment.
Figure 37B:
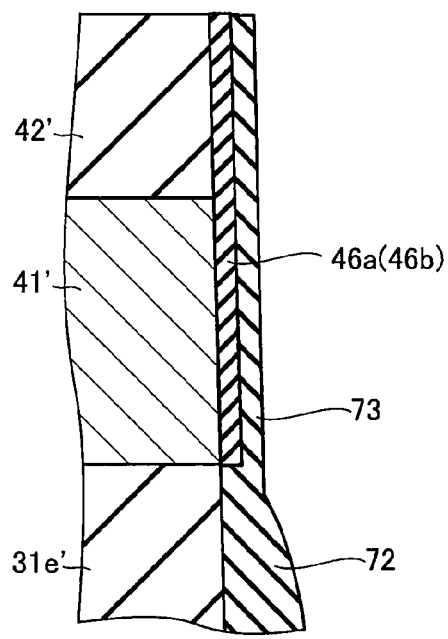
FIG. 37B is an enlarged view of FIG. 37A.
Figure 38A:
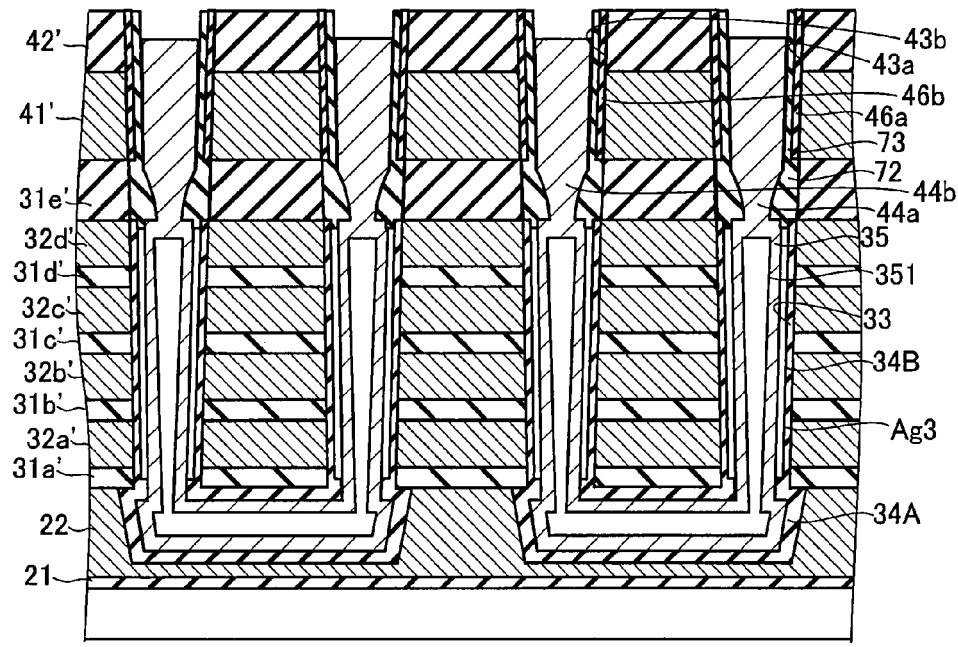
FIG. 38A is a cross-sectional view showing a manufacturing process of the nonvolatile semiconductor memory device in accordance with the sixth embodiment.
Figure 38B:
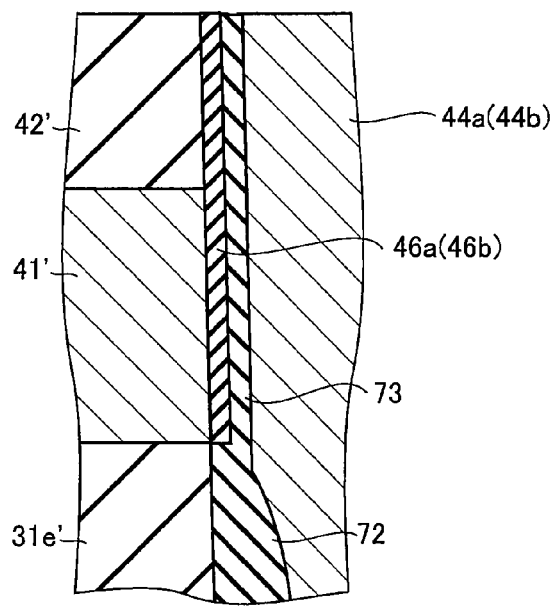
FIG. 38B is an enlarged view of FIG. 38A.
Figure 39A:
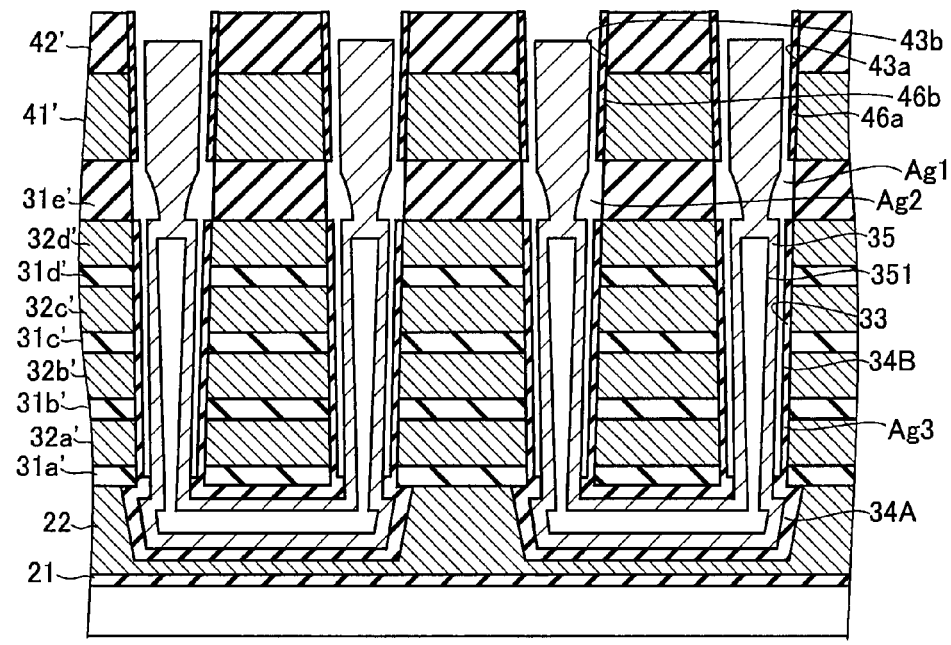
FIG. 39A is a cross-sectional view showing a manufacturing process of the nonvolatile semiconductor memory device in accordance with the sixth embodiment.
Figure 39B:
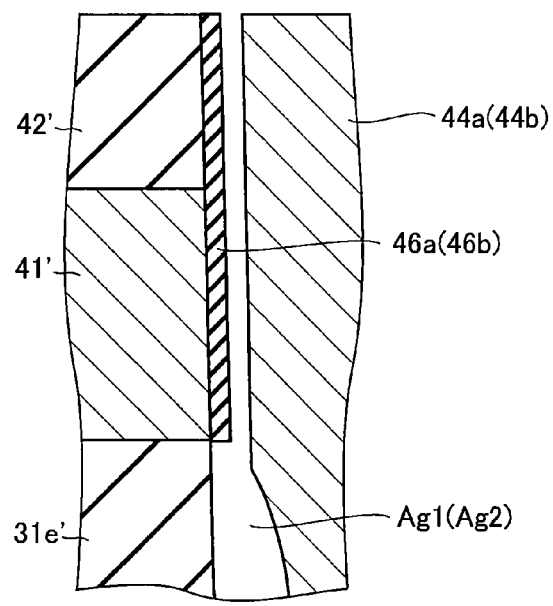
FIG. 39B is an enlarged view of FIG. 39A.

Next, a method of manufacturing the nonvolatile semiconductor memory device in accordance with the sixth embodiment is described with reference to FIGS. 37A-39B. FIGS. 37A, 38A, and 39A are cross-sectional views showing manufacturing processes of the nonvolatile semiconductor memory device in accordance with the sixth embodiment. FIGS. 37B, 38B, and 39B are enlarged views of FIGS. 37A, 38A, and 39A.

First, the processes for the fifth embodiment up to the process shown in FIG. 30 are carried out. Then, as shown in FIGS. 37A and 37B, silicon oxide ($SiO_2$) and silicon nitride (SiN) are deposited on a side wall facing the drain side holes 43a (the source side holes 43b) to form the first drain side gate insulating layer 46a (the first source side gate insulating layer 46b) and the sacrifice layers 73.

Next, polysilicon (p—Si) is deposited inside the drain side holes 43a (the source side holes 43b) so as to be in contact with the sacrifice layers 72 and 73, thereby forming the drain side columnar semiconductor layer 44a (the source side columnar semiconductor layer 44b), as shown in FIGS. 38A and 38B.

Subsequently, the sacrifice layers 72 and 73 are removed by hot phosphoric acid treatment to form the gaps Ag1 and Ag2, as shown in FIGS. 39A and 39B. Then, similar manufacturing processes as in the fifth embodiment are undergone to form the nonvolatile semiconductor memory device in accordance with the sixth embodiment shown in FIG. 36.

(Effect of the Nonvolatile Semiconductor Memory Device in Accordance with the Sixth Embodiment)

Next, an effect of the nonvolatile semiconductor memory device in accordance with the sixth embodiment is described. The nonvolatile semiconductor memory device in accordance with the sixth embodiment has a configuration that is substantially similar to that of the fifth embodiment, and thus displays a similar effect to that of the fifth embodiment.

In addition, the nonvolatile semiconductor memory device in accordance with the sixth embodiment includes the first drain side gate insulating layer 46a and the first source side gate insulating layer 46b, similarly to the second embodiment. Consequently, the nonvolatile semiconductor memory device in accordance with the sixth embodiment displays a similar effect to that of the second embodiment.

Other Embodiments

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

For example, in the above-described embodiments, the U-shaped semiconductor layer 35 includes the hollow 351 in an interior portion thereof. However, the U-shaped semiconductor layer 35 is not limited to the above-described embodiment and may also be one that does not include the hollow 351.

The U-shaped semiconductor layer 35 may be of a form in which an inside of the hollow 351 is completely filled with silicon (Si). Alternatively, the U-shaped semiconductor layer 35 may be of a form in which the inside of the hollow 351 is partially filled with silicon (Si). For example, the U-shaped semiconductor layer 35 may be of a form in which a void or seam is provided in the silicon (Si) filling the inside of the hollow 351.

Moreover, the U-shaped semiconductor layer 35 may be of a form in which the inside of the hollow 351 is completely filled by an insulating layer (for example, silicon oxide ($SiO_2$) or silicon nitride (SiN)). Alternatively, the U-shaped semiconductor layer 35 may be of a form in which the inside of the hollow 351 is partially filled by the insulating layer (for example, silicon oxide ($SiO_2$) or silicon nitride (SiN)). For example, the U-shaped semiconductor layer may be of a form in which a void or seam is provided in the insulating layer filling the inside of the hollow 351.

What is claimed is:

1. A nonvolatile semiconductor memory device, comprising:
   a plurality of memory strings, each of which has a plurality of electrically rewritable memory cells connected in series; and
   select transistors, one of which is connected to each of ends of each of said memory strings,
   each of said memory strings comprising:
   a first semiconductor layer having a pair of columnar portions extending in a perpendicular direction with respect to a substrate, and a joining portion formed so as to join lower ends of said pair of columnar portions;
   a charge storage layer formed to surround a side surface of said columnar portions; and
   a first conductive layer formed to surround the side surface of said columnar portions and said charge storage layer, and configured to function as a control electrode of said memory cells, and
   each of said select transistors comprising:
   a second semiconductor layer extending upwardly from an upper surface of said columnar portions; and
   a second conductive layer formed to surround a side surface of said second semiconductor layer with a gap interposed, and configured to function as a control electrode of said select transistors.

2. The nonvolatile semiconductor memory device according to claim 1,
   wherein each of said select transistors further comprises a first insulating layer formed in a side wall of said second conductive layer facing said gap.

3. The nonvolatile semiconductor memory device according to claim 1,
   wherein each of said select transistors further comprises a second insulating layer formed in a side wall of said second semiconductor layer facing said gap.

4. The nonvolatile semiconductor memory device according to claim 1,
   wherein said first semiconductor layer and said second semiconductor layer are formed continuously in an integrated manner.

5. The nonvolatile semiconductor memory device according to claim 4,
   wherein said first semiconductor layer and said second semiconductor layer have a hollow formed continuously from said first semiconductor layer through to said second semiconductor layer.

6. The nonvolatile semiconductor memory device according to claim 5,
   wherein said first semiconductor layer and said second semiconductor layer have an insulating layer formed to fill said hollow.

7. A nonvolatile semiconductor memory device, comprising:
- a plurality of memory strings, each of which has a plurality of electrically rewritable memory cells connected in series,
- each of said memory strings comprising:
- a first semiconductor layer having a pair of columnar portions extending in a perpendicular direction with respect to a substrate, and a joining portion formed so as to join lower ends of said pair of columnar portions;
- a charge storage layer formed to surround a side surface of said columnar portions with a gap interposed; and
- a first conductive layer formed to surround the side surface of said columnar portions and said charge storage layer, and configured to function as a control electrode of said memory cells.

8. The nonvolatile semiconductor memory device according to claim 7,
- wherein each of said memory strings further comprises a block insulating layer formed between said charge storage layer and said first conductive layer.

9. The nonvolatile semiconductor memory device according to claim 7,
- wherein each of said memory strings further comprises a tunnel insulating layer formed between said charge storage layer and said joining portion.

10. The nonvolatile semiconductor memory device according to claim 7,
- wherein said first semiconductor layer has a hollow.

11. The nonvolatile semiconductor memory device according to claim 10,
- wherein said first semiconductor layer has an insulating layer formed to fill said hollow.

12. The nonvolatile semiconductor memory device according to claim 7, further comprising:
- select transistors, one of which is connected to each of ends of each of said memory strings,
- each of said select transistors comprising:
- a second semiconductor layer extending upwardly from an upper surface of said columnar portions; and
- a second conductive layer formed to surround a side surface of said second semiconductor layer with a gap interposed, and configured to function as a control electrode of said select transistors.

13. The nonvolatile semiconductor memory device according to claim 12,
- wherein each of said select transistors further comprises a first insulating layer formed in a side wall of said second conductive layer facing said gap.

* * * * *